United States Patent
Watson et al.

(10) Patent No.: US 6,593,997 B1
(45) Date of Patent: Jul. 15, 2003

(54) STAGE ASSEMBLY INCLUDING A REACTION ASSEMBLY

(75) Inventors: Doug Watson, Campbell, CA (US); Andrew J. Hazelton, San Carlos, CA (US); Mike Binnard, Belmont, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/713,911

(22) Filed: Nov. 16, 2000

(51) Int. Cl.$^7$ .................. G03B 27/42; G03B 27/58; G03B 27/62
(52) U.S. Cl. .............. 355/53; 355/72; 355/75
(58) Field of Search .................. 355/53, 72–76; 310/10, 12; 318/649, 687; 378/34, 35

(56) References Cited

U.S. PATENT DOCUMENTS

| | | | |
|---|---|---|---|
| 5,208,497 A | * 5/1993 | Ishii et al. | 310/12 |
| 5,280,677 A | 1/1994 | Kubo et al. | |
| 5,815,246 A | * 9/1998 | Sperling et al. | 355/53 |
| 5,864,389 A | 1/1999 | Osanai et al. | |
| 5,969,441 A | * 10/1999 | Loopstra et al. | 310/12 |
| 5,991,005 A | 11/1999 | Horikawa et al. | |
| 6,028,376 A | * 2/2000 | Osanai et al. | 310/12 |
| 6,252,370 B1 | 6/2001 | Ebihara et al. | |
| 6,262,794 B1 | * 7/2001 | Miyajima | 355/53 |
| 6,271,606 B1 | 8/2001 | Hazelton | |
| 6,281,654 B1 | * 8/2001 | Lee | 355/53 |
| 6,322,060 B1 | 11/2001 | Mayama et al. | |
| 6,323,483 B1 | 11/2001 | Cleveland et al. | |
| 6,323,935 B1 | * 11/2001 | Ebihara et al. | 355/53 |
| 6,337,484 B1 | 1/2002 | Loopstra et al. | |
| 6,355,994 B1 | 3/2002 | Andeen et al. | |
| 6,359,679 B1 | 3/2002 | Ito et al. | |
| 6,408,045 B1 | 6/2002 | Matsui et al. | |
| 6,449,030 B1 | 9/2002 | Kwan | |

FOREIGN PATENT DOCUMENTS

| | | |
|---|---|---|
| JP | 7-142331 | 6/1995 |
| JP | 11-362591 | 12/1999 |
| WO | WO 98/28665 | 7/1998 |
| WO | WO 98/40791 | 9/1998 |
| WO | WO 01/47001 A1 | 6/2001 |

OTHER PUBLICATIONS

U.S. patent application Ser. No. 09/721,733, Nishi, filed Nov. 27, 2000.

* cited by examiner

Primary Examiner—Henry Hung Nguyen
(74) Attorney, Agent, or Firm—Steven G. Roeder; Jim Rose

(57) ABSTRACT

A stage assembly (10) for moving and positioning a device (26) is provided herein. The stage assembly (10) includes a stage base (12), a stage (14), a stage mover assembly (16), and a reaction assembly (18). The stage mover assembly (16) moves the stage (14) along an X axis and along a Y axis relative to the stage base (12). The reaction assembly (18) is coupled to the stage mover assembly (16). Uniquely, the reaction assembly (18) counteracts and reduces the reaction forces created by the stage mover assembly (16) in two degrees of freedom that are transferred to a reaction base (102). With this design, stage mover assembly (16) has less influence upon the position of the stage base (12). These features allow for more accurate positioning of the device (26) by the stage assembly (10) and better performance of the stage assembly (10).

40 Claims, 12 Drawing Sheets

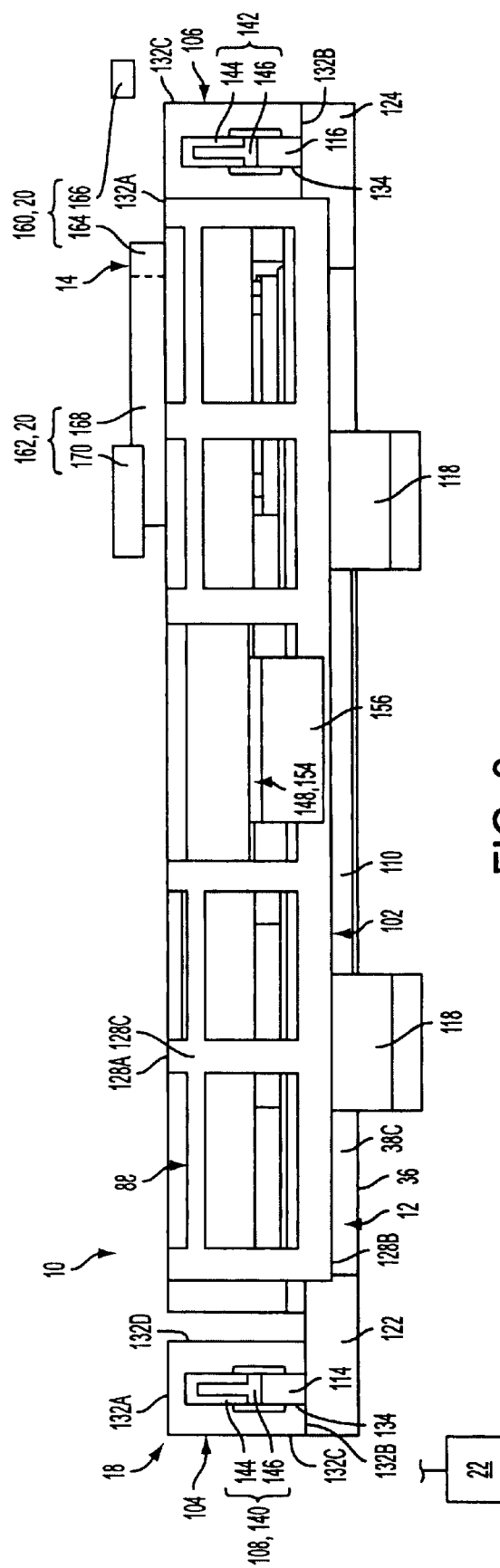

STAGE ASSEMBLY INCLUDING A REACTION ASSEMBLY

CROSS REFERENCE TO RELATED APPLICATIONS

As far as permitted, the disclosures of (i) U.S. patent application Ser. No. 09/714,598, entitled "A SYSTEM AND METHOD FOR RESETTING A REACTION MASS ASSEMBLY OF A STAGE ASSEMBLY," filed on Nov. 16, 2000, (ii) U.S. patent application Ser. No. 09/714,747, entitled, "STAGE ASSEMBLY INCLUDING A REACTION MASS ASSEMBLY," filed on Nov. 16, 2000, and (iii) U.S. patent application Ser. No. 09/713,910, entitled "STAGE ASSEMBLY INCLUDING A REACTION ASSEMBLY THAT IS CONNECTED BY ACTUATORS," filed on Nov. 16, 2000, are incorporated herein by reference.

FIELD OF THE INVENTION

The present invention is directed to a stage assembly for moving a device. More specifically, the present invention is directed to a stage assembly including a reaction assembly for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a mounting base with an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images and the features within the images transferred onto the wafer from the reticle are extremely small. Accordingly, the precise relative positioning of the wafer and the reticle is critical to the manufacturing of high density, semiconductor wafers.

Unfortunately, the wafer stage mover assembly generates reaction forces that can vibrate the wafer stage base and the apparatus frame. The vibration influences the position of the wafer stage base, the wafer stage, and the wafer. Similarly, the reticle stage mover assembly generates reaction forces that can vibrate the reticle stage base and the apparatus frame. The vibration influences the position of the reticle stage base, the reticle stage, and the reticle. As a result thereof, the vibration can cause an alignment error between the reticle and the wafer. This reduces the accuracy of positioning of the wafer relative to the reticle, or some other reference, and degrades the accuracy of the exposure apparatus. In light of the above, one object of the present invention is to provide a stage assembly that precisely positions a device. Another object is to provide a stage assembly that minimizes the influence of the reaction forces of the stage mover assembly upon the position of the stage, the stage base, and the apparatus frame. Still another object is to provide a stage assembly having an improved reaction assembly. Yet another object is to provide an exposure apparatus capable of manufacturing precision devices such as high density, semiconductor wafers.

SUMMARY

The present invention is directed to a stage assembly that moves a device relative to a stage base. The stage assembly includes a stage, a stage mover assembly, and a reaction assembly. The stage retains the device. The stage mover assembly moves the stage relative to the stage base with at least one degree of freedom. The reaction assembly includes a reaction base that is coupled to the stage mover assembly.

Uniquely, the reaction assembly counteracts the reaction forces generated by the stage mover assembly in the one degree of freedom that is transferred to the reaction base. As a result thereof, the stage assembly can more accurately position the device. Further, the stage assembly can be used in an exposure apparatus to manufacture high density, high quality semiconductor wafers.

As provided herein, the stage mover assembly can include one or more X stage movers and one or more Y stage movers that are coupled to the reaction assembly. The X stage movers move the stage along an X axis, and about a Z axis, while the Y stage movers move the stage along a Y axis. The stage mover assembly generates X reaction forces, Y reaction forces and theta Z reaction forces during the movement of the stage.

In the embodiments provided herein, the reaction assembly includes an X reaction mass, a Y reaction mass, and a reaction mover assembly. The X reaction mass moves along the reaction base to reduce the X reaction forces generated by the stage mover assembly that are transferred to the reaction base. The reaction mover assembly moves the Y reaction mass along the reaction base to counteract the Y reaction forces generated by the stage mover assembly. Additionally, the reaction mover assembly moves the X reaction mass and/or the Y reaction mass to counteract the theta Z reaction forces.

A number of alternate embodiments of the reaction assembly are provided herein. In one embodiment, the reaction base is fixedly secured to the stage base. In another embodiment, the reaction base is free to move relative to the stage base with at least three degrees of freedom. In yet another embodiment, the reaction base is fixedly secured to a mounting base independently of the stage base.

Preferably, the reaction mover assembly includes one or more trim movers that adjusts and corrects the position of the X reaction mass to inhibit an assembly center of gravity of the stage assembly from shifting.

The present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 3 is a side plan view of the stage assembly of FIG. 1;

FIG. 4 is a perspective view of a pair of attraction only actuators utilized in the stage assembly of FIG. 1;

DESCRIPTION

Figure 1:
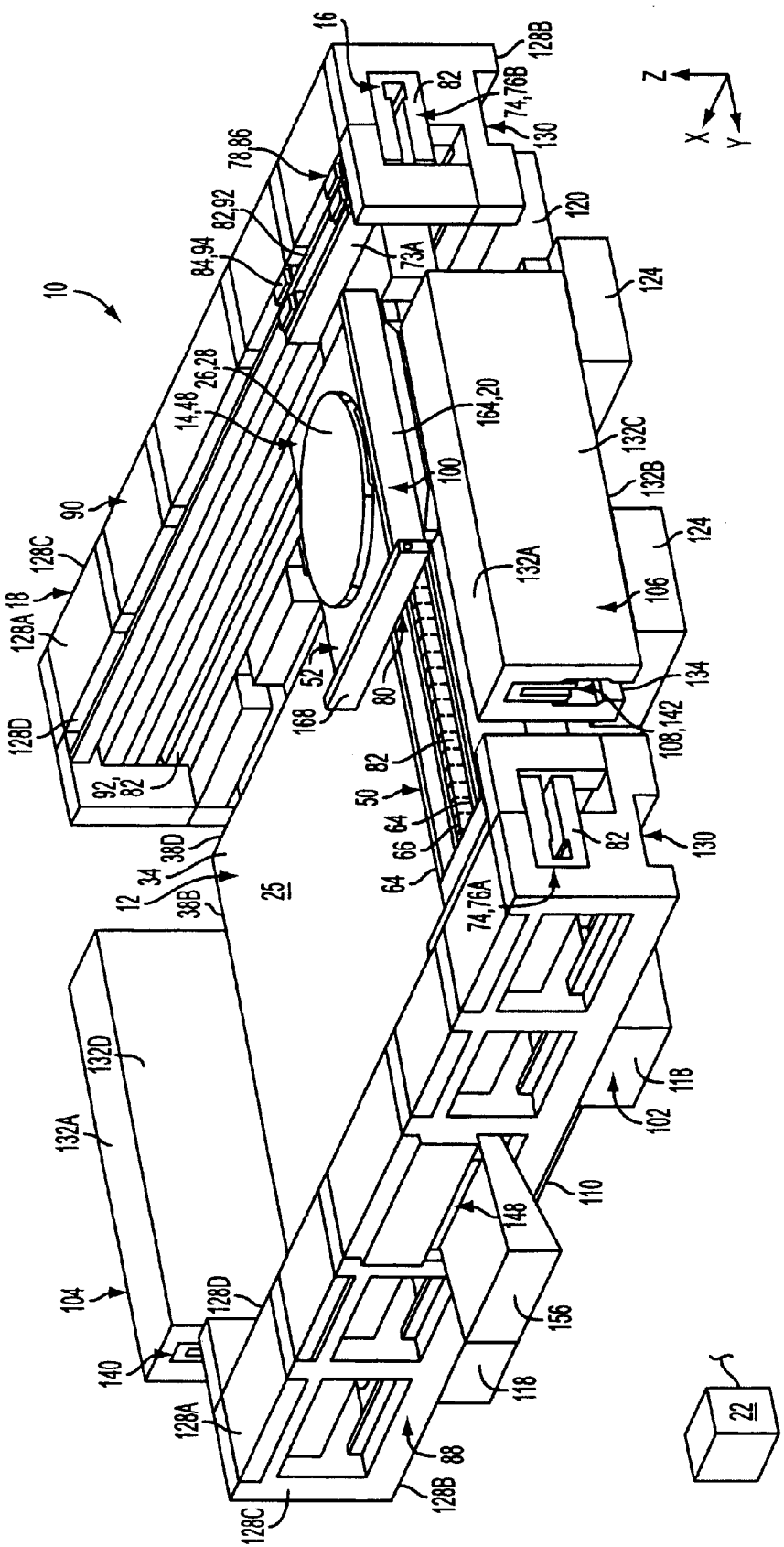
FIG. 1 is a perspective view of a first embodiment of a stage assembly having features of the present invention.
Figure 2:
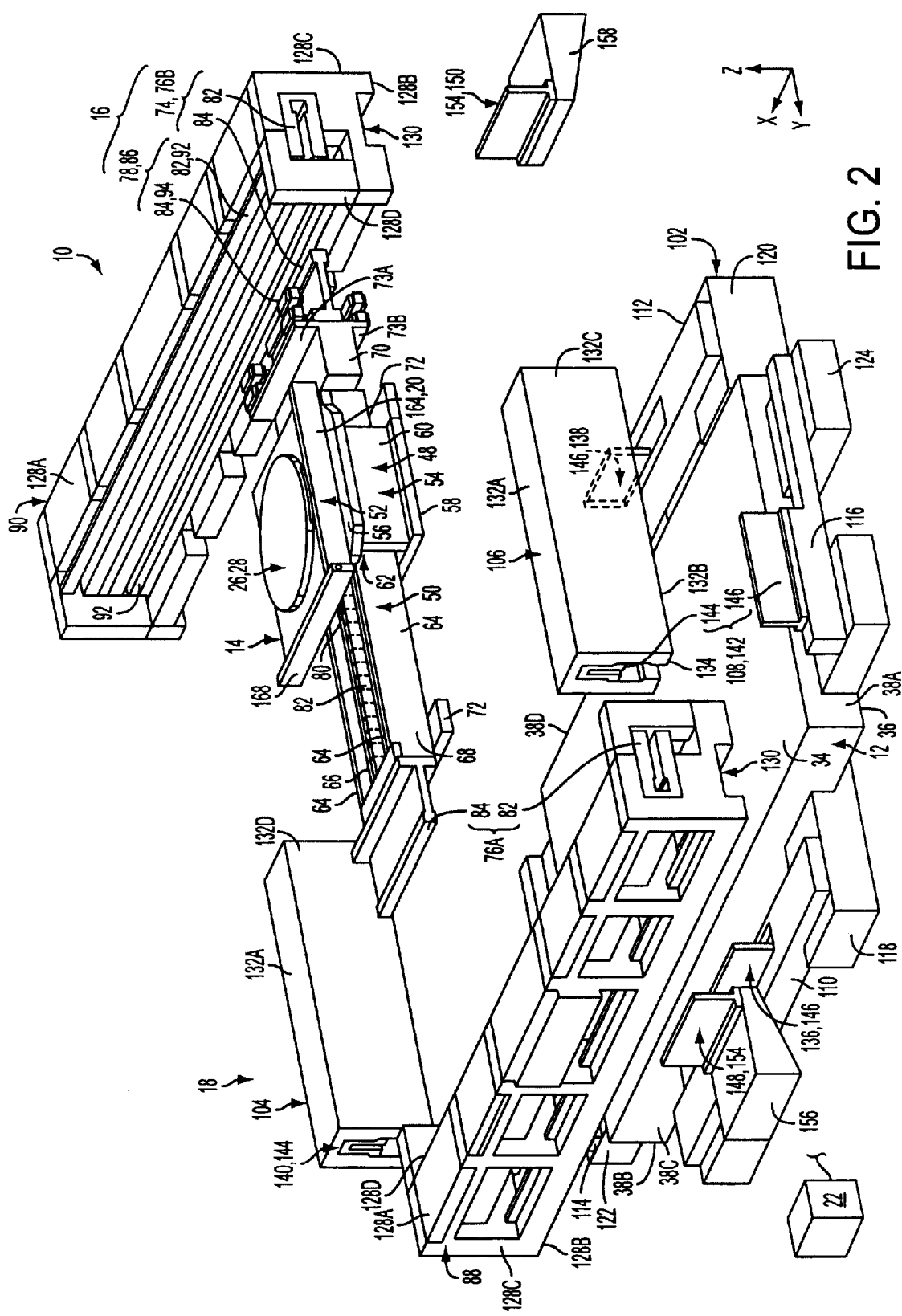
FIG. 2 is an exploded perspective of the stage assembly of FIG. 1.

Referring initially to FIGS. 1–3, a stage assembly 10 having features of the present invention, includes a stage base 12, a stage 14, a stage mover assembly 16, a reaction assembly 18, a measurement system 20 (illustrated in FIG. 3), and a control system 22. The stage assembly 10 is positioned above a mounting base 24 (illustrated in FIG. 11). The stage mover assembly 16 precisely moves the stage 14 relative to the stage base 12. As an overview, the reaction assembly 18 counteracts, reduces and minimizes the influence of the reaction forces from the stage mover assembly 16 on the position of the stage base 12 and the mounting base 24. Further, the reaction assembly 18 inhibits an assembly center of gravity 25 (illustrated in FIGS. 1, 5A and 5B) of the stage assembly 10 from shifting.

The stage assembly 10 is particularly useful for precisely positioning a device 26 during a manufacturing and/or an inspection process. The type of device 26 positioned and moved by the stage assembly 10 can be varied. For example, the device 26 can be a semiconductor wafer 28, and the stage assembly 10 can be used as part of an exposure apparatus 30 (illustrated in FIG. 11) for precisely positioning the semiconductor wafer 28 during manufacturing of the semiconductor wafer 28. Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 6:
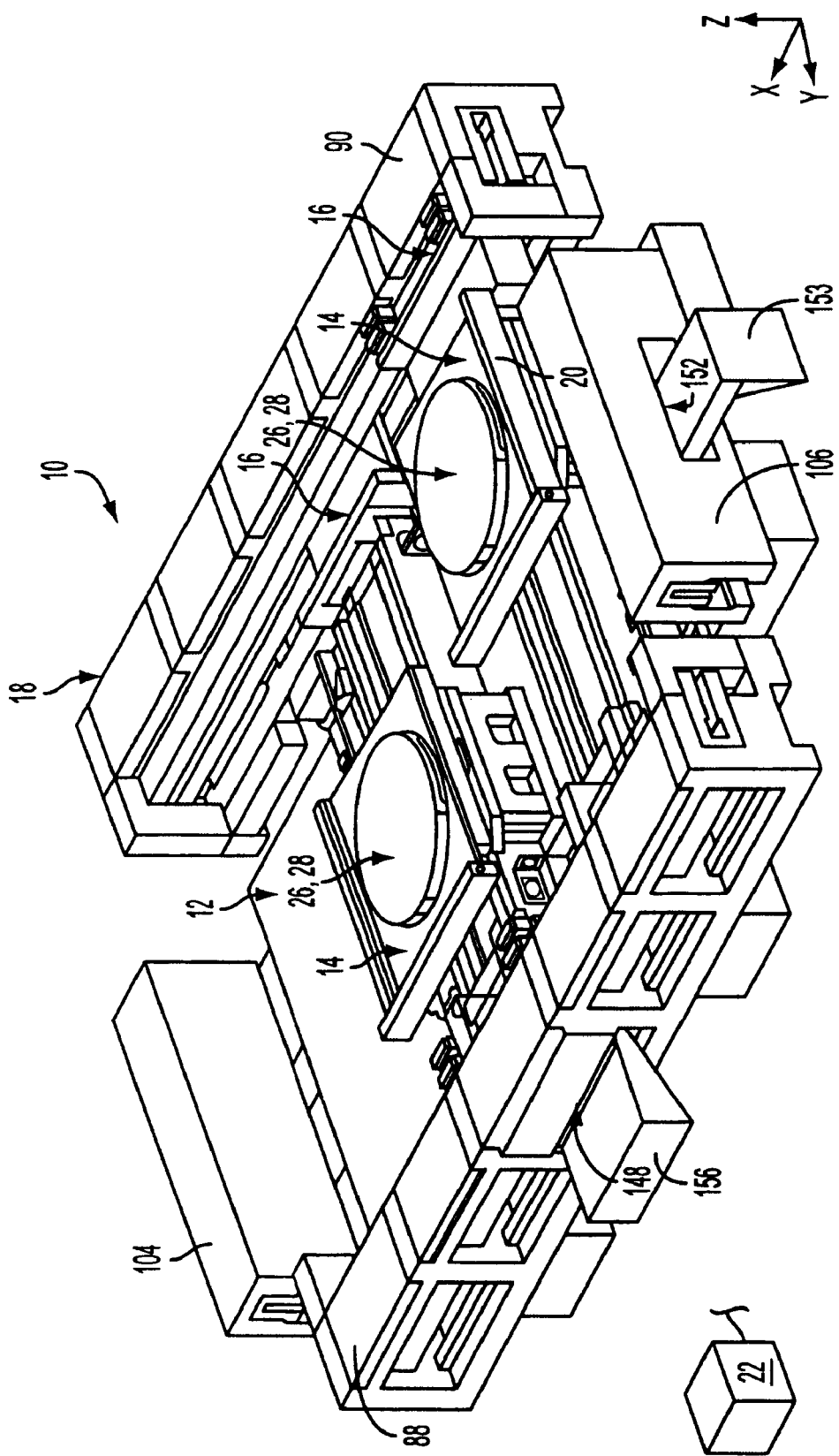
FIG. 6 is a perspective view of a second embodiment of a stage assembly having features of the present invention.

A number of alternate embodiments of the stage assembly 10 are illustrated in the Figures. In particular, FIG. 1 illustrates a perspective view of a first embodiment of the stage assembly 10, FIG. 6 illustrates a perspective view of a second embodiment of the stage assembly 10, FIG. 7 illustrates a perspective view of a third embodiment of the stage assembly 10, and FIG. 9 illustrates a perspective view of a fourth embodiment of the stage assembly 10.

Figure 7:
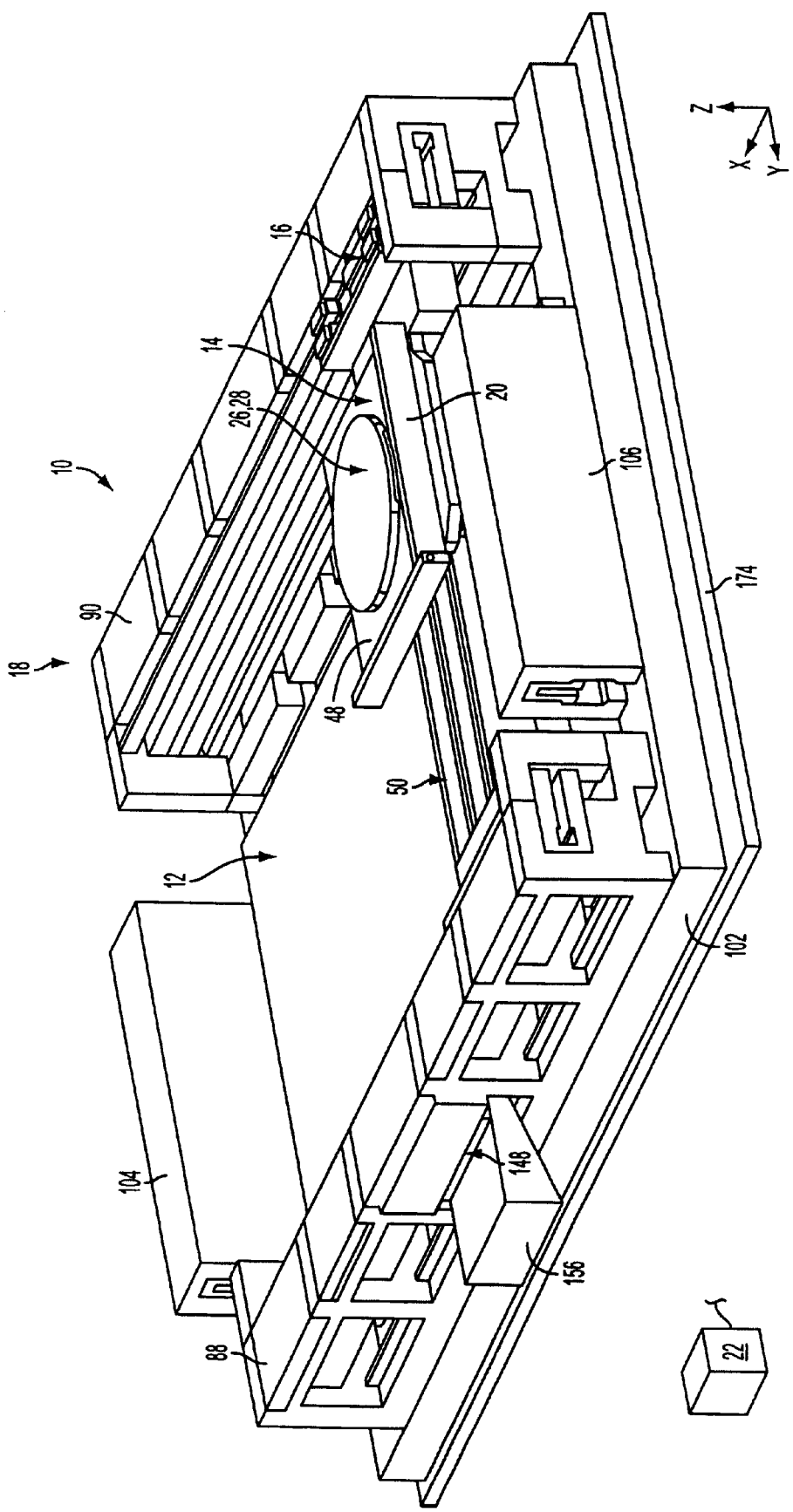
FIG. 7 is a perspective view of a third embodiment of a stage assembly having features of the present invention.
Figure 9:
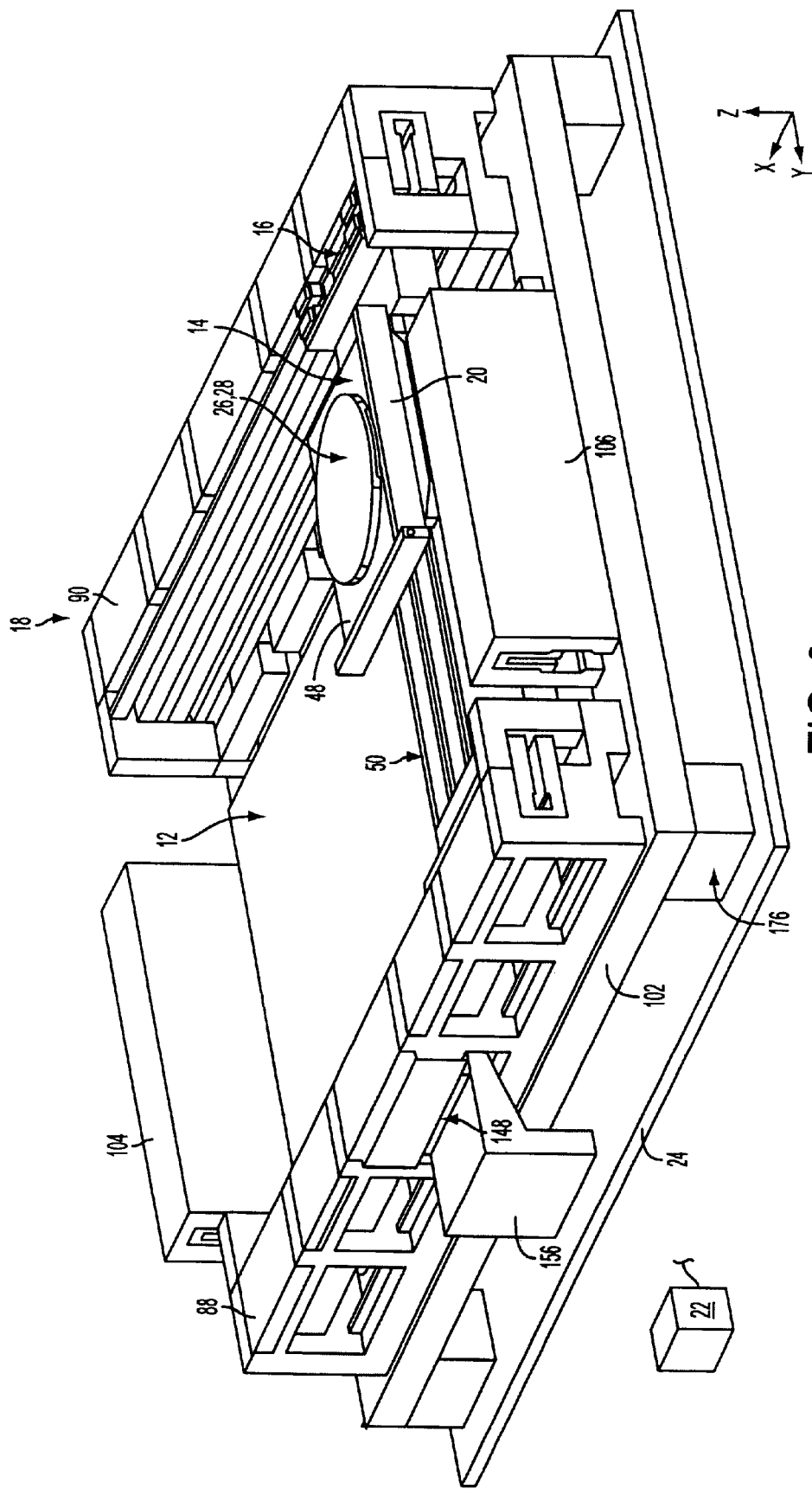
FIG. 9 is a perspective view of a fourth embodiment of a stage assembly having features of the present invention.

In the embodiment illustrated in FIGS. 1, 7, and 9, the stage assembly 10 includes one stage 14 that is moved relative to the stage base 12. Alternately, in the embodiment illustrated in FIG. 6, the stage assembly 10 includes two stages 14 that independently move relative to the stage base 12. In each embodiment, each stage 14 is at least moved relative to the stage base 12 along the X axis, along the Y axis, and about the Z axis (collectively "the planar degrees of freedom"). More specifically, the stage mover assembly 16 moves and positions the stage 14 along the X axis, along the Y axis, and about the Z axis under the control of the control system 22.

The reaction assembly 18 provided herein, counteracts the reaction forces from the stage mover assembly 16. This minimizes the distortion of the stage base 12 and improves the positioning performance of the stage assembly 10. Further, for an exposure apparatus 30, this allows for more accurate positioning of the semiconductor wafer 28 relative to a reticle 32 (illustrated in FIG. 11).

The stage base 12 supports a portion of the stage assembly 10 above the mounting base 24. The design of the stage base 12 can be varied to suit the design requirements of the stage assembly 10. In the embodiment illustrated herein, the stage base 12 is generally rectangular shaped and includes (i) a planar base top 34, (ii) an opposed base bottom 36, (iii) a front base side 38A, (iv) a rear base side 38B, (v) a left base side 38C, and (vi) a right base side 38D.

Figure 11:
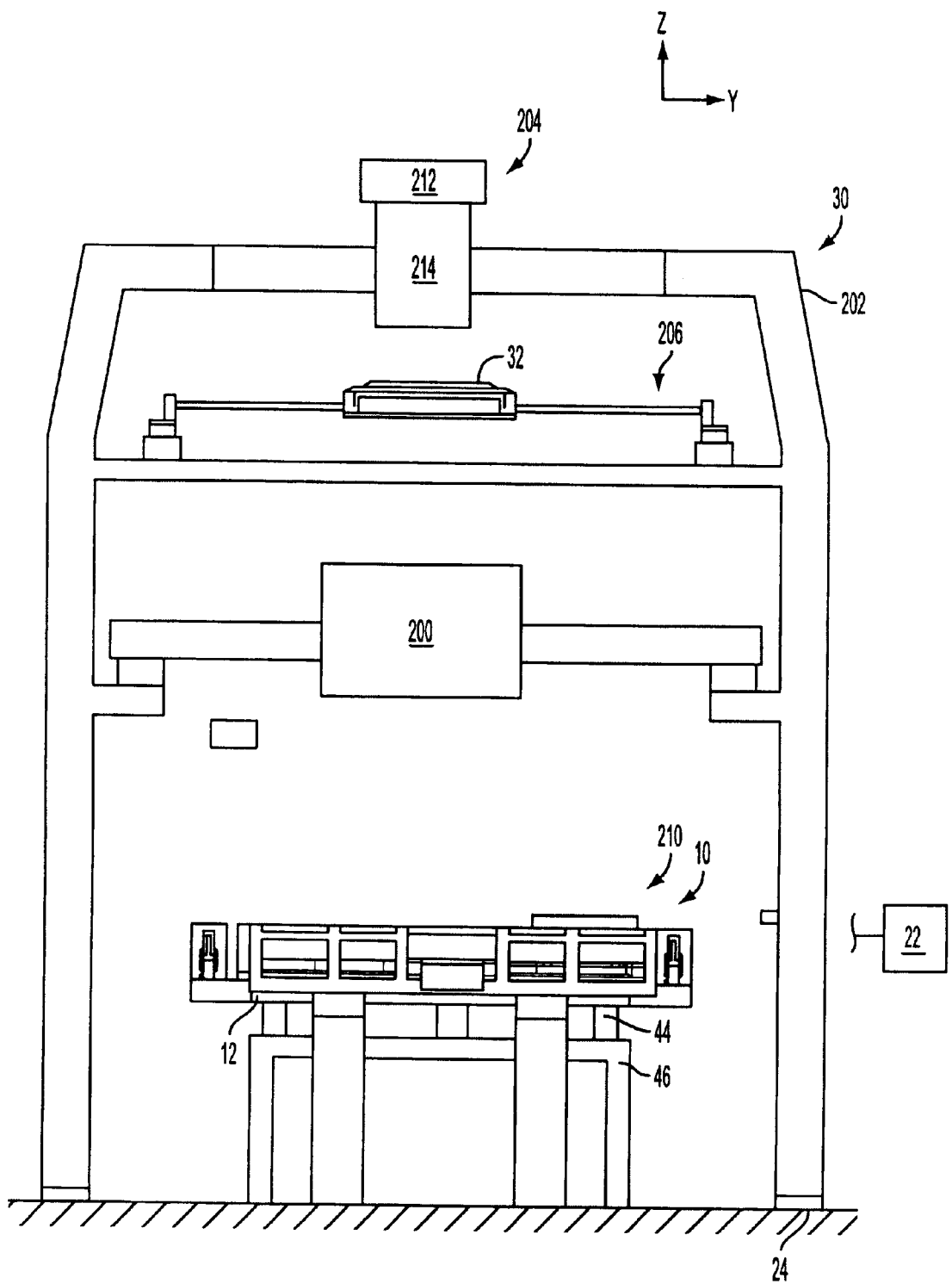
FIG. 11 is a schematic illustration of an exposure apparatus having features of the present invention.

As illustrated in FIG. 11, the stage base 12 can be secured with resilient base isolators 44 and a base frame 46 to the mounting base 24. The base isolators 44 reduce the effect of vibration of the base frame 46 and the mounting base 24 causing vibration on the stage base 12. Further, the base isolators 44 can adjust the position of the stage base 12 relative to the base frame 46. Typically, three or four spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

The stage 14 retains the device 26. The stage 14 is precisely moved by the stage mover assembly 16 to precisely position the device 26. The design of the stage 14 can be varied to suit the design requirements of the stage assembly 10. In the embodiment illustrated herein, the stage 14 includes a device table 48, a guide assembly 50, a portion of the stage mover assembly 16, and a portion of the measurement system 20.

The design and movement of the device table 48 for each stage 14 can be varied. In the embodiment illustrated in FIGS. 1–3, the device table 48 moves relative to the guide assembly 50 along the Y axis. Further, the device table 48 includes: (i) an upper table component 52, (ii) a lower table component 54 positioned below the upper table component 52, and (iii) a table mover assembly (not shown). In this design, the table mover assembly moves the upper table component 52 relative to the lower table component 54.

The upper table component 52 is generally rectangular shaped. The upper table component 52 includes a device holder (not shown) and a portion of the measurement system 20. The device holder retains the device 26 during movement. The device holder can be a vacuum chuck, an electrostatic chuck, or some other type of clamp.

The lower table component 54 is somewhat rectangular shaped and includes a table component top 56, a table component bottom 58, a pair of spaced apart, table component sides 60 (only one is illustrated in the Figures) and a guide opening 62. The guide opening 62 is sized and shaped to receive a portion of the guide assembly 50. In the embodiment illustrated in FIGS. 1 and 2, the guide opening 62 is generally rectangular shaped and extends longitudinally along the lower table component 54.

In the embodiments provided herein, the device table 48 is maintained above the stage base 12 with a vacuum preload type fluid bearing. More specifically, the table component bottom 58 includes a plurality of spaced apart fluid outlets (not shown), and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between the lower table component 54 and the stage base 12. The vacuum preload type fluid bearing allows for motion of the lower table component 54 relative to the stage base 12 along the X axis, along the Y axis and about the Z axis relative to the stage base 12.

Further, the device table 48 is maintained apart from the guide assembly 50 with a fluid bearing. More specifically, in this embodiment, each of the table component sides 60 includes a plurality of spaced apart fluid outlets. Pressurized fluid (not shown) is released from the fluid outlets towards the guide assembly 50 to create a fluid bearing between the lower table component 54 and the guide assembly 50. The fluid bearing allows for motion of the lower table component 54 relative to the guide assembly 50 along the Y axis. Further, the fluid bearing inhibits motion of the lower table component 54 relative to the guide assembly 50 along the X axis and about the Z axis.

Alternately, the device table 48 can be supported spaced apart from the stage base 12 and the guide assembly 50 in other ways. For example, a magnetic type bearing (not shown) or a roller bearing type assembly (not shown) could be utilized.

The table mover assembly adjusts the position of the upper table component 52 relative to the lower table component 54 and the stage base 12. The design of the table mover assembly can be varied to suit the design requirements to the stage assembly 10. For example, the table mover assembly can adjust the position of the upper table component 52 and the device holder relative to the lower table component 54 with six degrees of freedom. Alternately, for example, the table mover assembly (not shown) can be designed to move the upper table component 52 relative to the lower table component 54 with only three degrees of freedom. The table mover assembly can include one or more rotary motors, voice coil motors, linear motors, electromagnetic actuators, or other type of actuators. Still alternately, the upper table component 52 could be fixed to the lower table component 54

The guide assembly 50 is used to move the device table 48 along the X axis and about the Z axis and guide the movement of the device table 48 along the Y axis. The design of the guide assembly 50 can be varied to suit the design requirements of the stage assembly 10. In the embodiment illustrated in FIGS. 1 and 2, the guide assembly 50 includes a pair of spaced apart outer beams 64, a center beam 66, a left guide end 68, and a spaced apart right guide end 70. The outer beams 64 and the center beam 66 are spaced apart, substantially parallel, and extend between the guide ends 68, 70.

The guide ends 68, 70 secure the beams 64, 66 together and secure a portion of the stage mover assembly 16 to the guide assembly 50. Additionally, each of the guide ends 68, 70 includes a guide fluid pad 72. In this embodiment, each of the guide fluid pads 72 includes a plurality of spaced apart fluid outlets (not shown), and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between each of the guide fluid pads 72 and the stage base 12. The vacuum preload type, fluid bearing maintains the guide assembly 50 spaced apart along the Z axis relative to the stage base 12 and allows for motion of the guide assembly 50 along the X axis, along the Y axis, and about the Z axis relative to the stage base 12.

Additionally, the right guide end 70 includes an upper plate 73A and a spaced apart lower plate 73B for securing a portion of the stage mover assembly 16 to the guide assembly 50.

The components of the stage 14 can be made of a number of materials including ceramic, such as alumina or silicon carbide; metals such as aluminum; composite materials; or plastic.

The stage mover assembly 16 controls and moves the stage 14 relative to the stage base 12. When the stage mover assembly 16 applies a force to move the stage 14 along the X axis, along the Y axis, and/or about the Z axis, an equal and opposite first reaction force is applied to the reaction assembly 18.

The design of the stage mover assembly 16 and the movement of the stage 14 can be varied to suit the movement requirements of the stage assembly 10. In the embodiment illustrated in FIGS. 1–3, the stage mover assembly 16 moves the stage 14 with a relatively large displacement along the X axis, a relatively large displacement along the Y axis, and a limited displacement about the Z axis (theta Z) relative to the stage base 12. In this embodiment, the stage mover assembly 16 includes (i) a X stage mover system 74 having a left X stage mover 76A and a right X stage mover 76B, (ii) a Y guide mover 78, and (iii) a Y stage mover 80. The X stage mover system 74 moves the stage 14 along the X axis and about the Z axis. The Y guide mover 78 moves the guide assembly 50 along the Y axis and the Y stage mover 80 moves the stage 14 along the Y axis. More specifically, in this embodiment, (i) the X stage mover system 74 moves the guide assembly 50 with a relatively large displacement along the X axis and with a limited range of motion about the Z axis (theta Z), (ii) the Y guide mover 78 moves the guide assembly 50 with a small displacement along the Y axis, and (iii) the Y stage mover 80 moves the device table 48 with a relatively large displacement along the Y axis.

The design of each mover 76A, 76B, 78, 80 can be varied to suit the movement requirements of the stage assembly 10. As provided herein, each of the movers 76A, 76B, 78, 80 includes a reaction component 82 and an adjacent moving component 84 that interacts with the reaction component 82. In the embodiments provided herein, the Y guide mover 78 includes an opposed pair of attraction type actuators 86. Further, in the embodiments provided herein, for the X stage movers 76A, 76B and the Y stage mover 80, one of the components 82, 84 includes one or more magnet arrays (not shown) and the other component 82, 84 includes one or more conductor arrays (not shown).

Each magnet array includes one or more magnets. The design of each magnet array and the number of magnets in each magnet array can be varied to suit the design requirements of the movers 76A, 76B, 80. Each magnet can be made of a permanent magnetic material such as NdFeB.

Each conductor array includes one or more conductors. The design of each conductor array and the number of conductors in each conductor array is varied to suit the design requirements of the movers 76A, 76B, 80. Each conductor can be made of metal such as copper or any substance or material responsive to electrical current and capable of creating a magnetic field such as superconductors.

Electrical current (not shown) is supplied to the conductors in each conductor array by the control system 22. For each mover 76A, 76B, 80, the electrical current in the conductors interacts with the magnetic field(s) generated by the one or more magnets in the magnet array. This causes a force (Lorentz type force) between the conductors and the magnets that can be used to move the stage 14 relative to the stage base 12.

Specifically, the reaction component 82 and the moving component 84 of each X stage mover 76A, 76B interact to selectively move the stage 14 along the X axis and about the Z axis relative to the stage base 12. In the embodiment illustrated herein, each X stage mover 76A, 76B is a commutated, linear motor. The reaction component 82 for the left X stage mover 76A is secured to a left X reaction mass 88 of the reaction assembly 18 while the moving component 84 of the left X stage mover 76A is secured to the left guide end 68 of the guide assembly 50. Similarly, the reaction component 82 for the right X stage mover 76B is secured to a right X reaction mass 90 of the reaction assembly 18 while the moving component 84 of the right X stage mover 76B is secured to the right guide end 70 of the guide assembly 50.

In this embodiment, the reaction component 82 of each X stage mover 76A, 76B includes a pair of spaced apart magnet arrays while the moving component 84 of each X stage mover 76A, 76B includes a conductor array. Alternately, for example, the reaction component 82 can include a conductor array while the moving component 84 can include a pair of spaced apart magnet arrays.

With the design provided herein, the X stage movers 76A, 76B make relatively large displacement adjustments to the position of the guide assembly 50 along the X axis. The required stroke of the X stage movers 76A, 76B along the X axis will vary according to desired use of the stage assembly 10. For an exposure apparatus 30, generally, the stroke of the X stage movers 76A, 76B for moving the semiconductor wafer 28 is between approximately two hundred (200) millimeters and one thousand (1000) millimeters.

The X stage movers 76A, 76B also make relatively slight adjustments to the position of the stage 14 about the Z axis. In order to make the adjustments about the Z axis, the moving component 84 of one of the X stage movers 76A, 76B is moved relative to the moving component 84 of the other X stage mover 76A, 76B. With this design, the X stage movers 76A, 76B generate torque about the Z axis. A gap (not shown) exists between the reaction component 82 and the moving component 84 of each X stage mover 76A, 76B to allow for slight movement of the stage 14 about the Z axis. Typically, the gap is between approximately one millimeter and five millimeters. However, depending upon the design of the particular mover, a larger or smaller gap may be utilized.

The Y guide mover 78 selectively moves the guide assembly 50 along the axis relative to the stage base 12. In the embodiment illustrated herein, the Y guide mover 78 includes a plurality of opposed pairs of the attraction only type actuators 86. FIG. 4 illustrates a perspective view of a preferred pair of attraction type actuators 86. More specifically, FIG. 4 illustrates a perspective view of a pair of spaced E/I core type electromagnetic actuators. Each E/I core actuator includes an I shaped core 92 and a combination 94 that includes an E shaped core 96 and a tubular conductor 98. The E core 96 and the I core 92 are each made of a magnetic material such as iron, silicon steel, or Ni—Fe steel. The conductor 98 is positioned around the center bar of the E core 96.

In FIGS. 1 and 2, the Y guide mover 78 includes (i) four, opposed pairs of the combination 94 of the E core 96 and conductor 98 and (ii) two rows of I cores 92. Two of the opposed pairs of the combination 94 are secured to the upper plate 73A of the right guide end 70 and two of the opposed pairs of the combination 94 are secured to the lower plate 73B of the right guide end 70. The rows of I cores 92 are secured to the right X reaction mass 90 with one row of I cores 92 positioned between the combinations 94 that are secured to the upper plate 73A and one row of I cores 92 positioned between the combinations 94 that are secured to the lower plate 73B. In this embodiment, the combinations 94 are considered the moving component 84 of the Y guide mover 78 and rows of I cores 92 are considered the reaction component 82 of the Y guide mover 78.

The Y stage mover 80 moves the stage 14 with a relatively large displacement along the Y axis relative to the stage base 12. More specifically, the reaction component 82 (illustrated in phantom in FIGS. 1 and 2) and the moving component (not shown) of the Y stage mover 80 interact to selectively move the device table 48 along the Y axis relative to the guide assembly 50. In the embodiment illustrated in the FIGS. 1 and 2, the Y stage mover 80 is a commutated, linear motor. The reaction component 82 for the Y stage mover 80 is secured to the center beam 66 of the guide assembly 50, and the moving component is secured to the device table 48, near the guide opening 62. In this embodiment, the reaction component 82 of the Y stage mover 80 includes a conductor array and the moving component of the Y stage mover 80 includes a magnet array. Alternately, for example, the reaction component 82 of the Y stage mover 80 could include a conductor array while the moving component 84 of the Y stage mover 80 could include a conductor array.

With this design, the Y stage mover 80 makes relatively large displacement adjustments to the position of the device table 48 along the Y axis. The required stroke of the Y stage mover 80 along the Y axis will vary according to desired use of the stage assembly 10. For an exposure apparatus 30, generally, the stroke of the Y stage mover 80 for moving the semiconductor wafer 28 is between approximately one hundred (100) millimeters and six hundred (600) millimeters.

Preferably, the movers 76A, 76B, 78, 80 are positioned to push through a stage center of gravity 100 of the stage 14. In the embodiment illustrated in FIGS. 1 and 2, the X stage movers 76A, 76B and the Y stage mover 80 are positioned at approximately the same position along the Z axis as the stage center of gravity 100. Further, the upper actuators 86 of the Y guide mover 78 are positioned a fixed distance above the stage center of gravity 100 (illustrated in FIGS. 1, 5A and 5B) and the lower actuators 86 of the Y guide mover 78 are positioned the same distance below the stage center of gravity 100.

The reaction assembly 18 preferably counteracts, reduces and minimizes the influence of the reaction forces from the stage mover assembly 16 on the position of the stage base 12 and the mounting base 24. Further, the reaction assembly 18 inhibits the assembly center of gravity 25 from shifting. As provided above, the reaction component 82 of each X stage mover 76A, 76B and the Y guide mover 78 is coupled to the X reaction masses 88, 90. With this design, the reaction forces generated by all of the movers 76A, 76B, 78, 80 are transferred to the reaction assembly 18.

The design of the reaction assembly 18 can be varied to suit the design requirements of the stage assembly 10. In the embodiment illustrated in FIGS. 1–3, the reaction assembly 18 includes a reaction base 102, the left X reaction mass 88, the right X reaction mass 90, a rear Y reaction mass 104, a front Y reaction mass 106 and a reaction mover assembly 108.

As an overview, through the principle of conservation of momentum, movement of the stage 14 with the X stage movers 76A, 76B along the X axis in one direction, generates an equal but opposite X reaction force that moves the X reaction masses 88, 90 in the opposite direction along the X axis. Movement of the stage 14 and/or the guide assembly 50 with the Y movers 78, 80 along the Y axis in one direction, creates an equal but opposite Y reaction force on the X reaction masses 88, 90 and the reaction base 102 along the Y axis. Additionally, movement of the stage 14 with the movers 76A, 76B, 78, 80 can generate a theta Z reaction force (torque) about the Z axis.

As provided herein, the X reaction masses 88, 90 move along the X axis to reduce the X reaction force that is transferred to the reaction base 102. Further, the reaction mover assembly 108 moves the Y reaction masses 104, 106 to counteract the Y reaction forces that are imparted upon the X reaction masses 88, 90 and the reaction base 102 by the Y movers 78, 80. Additionally, the reaction mover assembly 108 moves the X reaction masses 88, 90 and/or the Y reaction masses 104, 106 to counteract the theta Z reaction force that is imparted upon the X reaction masses 88, 90 and the reaction base 102 by the stage mover assembly 16. Stated another way, the theta Z reaction force can be counteracted by moving the X reaction masses 88, 90, by moving the Y reaction masses 104, 106, or by moving all of the reaction masses 88, 90, 104, 106. Thus, the reaction mover assembly 108 counteracts, reduces and minimizes the influence of the reaction forces from the stage mover assembly 16 on the position of the reaction base 102, the stage base 12 and the mounting base 24. This inhibits the reaction forces from the stage mover assembly 16 from influencing the position of the stage base 12.

The reaction base 102 supports each of the reaction masses 88, 90, 104, 106 and guides movement of each of the reaction masses 88, 90, 104, 106. A number of alternate embodiments of the reaction base 102 are provided in the Figures. In each of the embodiments, the reaction base 102 includes (i) a left X guide 110 for guiding movement the left X reaction mass 88 along the X axis, (ii) a right X guide 112 for guiding movement the right X reaction mass 90 along the X axis, (iii) a rear Y guide 114 for guiding movement the rear Y reaction mass 104 along the Y axis, and (iv) a front Y guide 116 for guiding movement the front Y reaction mass 106 along the Y axis. In each embodiment illustrated in the Figures, each of the guides 110, 112, 114, 116 is rectangular shaped.

In the embodiment illustrated in the FIGS. 1–3, the reaction base 102 is fixedly secured to the stage base 12. In this embodiment, the reaction base 102 also includes (i) a pair of spaced apart left X beams 118 that extend away from the left base side 38C for fixedly securing the left X guide 110 to the stage base 12, (ii) a pair of spaced apart right X beams 120 (only one is illustrated in the Figures) that extend away from the right base side 38D for fixedly securing the right X guide 112 to the stage base 12, (iii) a pair of spaced apart rear Y beams 122 (only one is illustrated in the Figures) that extend away from the rear base side 38B for fixedly securing the rear Y guide 114 to the stage base 12, and (iv) a pair of spaced apart front Y beams 124 that extend away from the front base side 38A for fixedly securing the front Y guide 116 to the stage base 12.

The design of the reaction masses 88, 90, 104, 106 can be varied to suit the design requirements of the reaction assembly 18. For each of the embodiments provided herein, the ratio of the mass of the reaction masses 88, 90, 104, 106 to the mass of the stage 14 is preferably relatively high. This will minimize the movement of the reaction masses 88, 90, 104, 106 and minimize the required travel of the reaction mover assembly 108. A suitable ratio of the mass of the reaction masses 88, 90, 104, 106 to the mass of the stage 14 is between approximately 2:1 and 10:1. A larger mass ratio is better, but is limited by the physical size of the reaction assembly 18.

In the embodiment illustrated in the Figures, each of the X reaction masses 88, 90 is somewhat rectangular shaped and includes an X mass top 128A, an X mass bottom 128B, an X mass outer side 128C, and an X mass inner side 128D. Each of the X reaction masses 88, 90 also includes a X mass follower 130 that interacts with one the X guides 110, 112 of the reaction base 102 to allow for movement of each X reaction mass 88, 90 along the X axis. In the embodiment illustrated in FIGS. 1–3, each X mass follower 130 is a rectangular shaped channel that extends into the X mass bottom 128B of each X reaction mass 88, 90.

The left X reaction mass 88 includes a somewhat rectangular shaped channel that extends into the mass inner side 128D. In this embodiment, the reaction component 82 of the left X stage mover 76A is positioned within the channel and secured to the left X reaction mass 88.

The right X reaction mass 90 includes a rectangular shaped channel that extends into the mass inner side 128D. In this embodiment, the rows of I cores 92 for the Y guide mover 78 are secured to the mass inner side 128D of the right X reaction mass 90. Additionally, the reaction component 82 of the right X stage mover 76B is positioned within the channel of the right X reaction mass 90.

In the embodiment illustrated in the Figures, each of the Y reaction masses 104, 106 is somewhat rectangular shaped and includes a Y mass top 132A, a Y mass bottom 132B, a Y mass outer side 132C, and a Y mass inner side 132D. Each of the Y reaction masses 104, 106 also includes a Y mass follower 134 that interacts with one the Y guides 114, 116 of the reaction base 102 to allow for movement of each of the Y reaction masses 104, 106 along the Y axis. In the embodiment illustrated in FIGS. 1–3, each Y mass follower 134 is a rectangular shaped channel that extends into the Y mass bottom 132B of each Y reaction mass 104, 106.

In this embodiment, the reaction masses 88, 90, 104, 106 are maintained above the reaction base 102 with a vacuum preload type fluid bearing. More specifically, in this embodiment, each of the reaction masses 88, 90, 104, 106 includes a plurality of spaced apart fluid outlets (not shown), and a plurality of spaced apart fluid inlets (not shown). Pressurized fluid (not shown) is released from the fluid outlets towards the reaction base 102 and a vacuum is pulled in the fluid inlets to create a vacuum preload type, fluid bearing between the reaction masses 88, 90, 104, 106 and the reaction base 102. The vacuum preload type fluid bearing maintains the reaction components spaced apart along the Z axis, relative to the reaction base. Further, the vacuum preload type fluid bearing allows for motion of the X reaction masses 88, 90 along the X axis and the Y reaction masses 104, 106 along the Y axis relative to the reaction base 102.

Alternately, the reaction masses 88, 90, 104, 106 can be supported spaced apart from the reaction base 102 in other ways. For example, a magnetic type bearing (not shown) or a roller type bearing (not shown) could be utilized that allows for motion of the reaction masses 88, 90, 104, 106 relative to the reaction base 102.

The reaction mover assembly 108 moves the X reaction masses 88, 90 and the Y reaction masses 104, 106 to counteract reaction forces generated by the movers 76A, 76B, 78, 80. More specifically, the reaction mover assembly 108 moves the X reaction masses 88, 90 to create a theta Z correction force that counteracts any theta Z reaction forces that are imparted upon the X reaction masses 88, 90. Further, the reaction mover assembly 108 moves the Y reaction masses 102, 104 to counteract any Y reaction forces created by the movement of the stage 14 and/or the guide assembly 50 with the Y movers 78, 80 along the Y axis. Stated another way, when the Y movers 78, 80 move the stage 14 and/or the guide assembly 50 along the Y axis in one direction, the reaction mover assembly 108 moves the Y reaction masses 102, 104 in the opposite direction to impart an equal and opposite Y correction force upon the reaction base 102 and the stage base 12.

The design of the reaction mover assembly 108 can be varied according to the design requirements of the stage assembly 10. In the embodiment illustrated in the Figures, the reaction mover assembly 108 includes (i) a left X reaction mover 136 that moves the left X reaction mass 88 relative to the left X guide 110, (ii) a right X reaction mover 138 that moves the right X reaction mass 90 relative to the right X guide 112, (iii) a rear Y reaction mover 140 that moves the rear Y reaction mass 104 relative to the rear Y guide 114, (iv) a front Y reaction mover 142 that moves the front Y reaction mass 106 relative to the front Y guide 116.

Each of reaction movers 136, 138, 140, 142 can include one or more rotary motors, voice coil motors, linear motors, electromagnetic actuators, and/or force actuators. In the embodiment illustrated in the Figures, each of the reaction movers 136, 138, 140, 142 includes a first component 144, and an adjacent second component 146. In the embodiments provided herein, one of the components 144, 146 of each reaction mover 136, 138, 140, 142 includes one or more magnet arrays (not shown) and the other component 144, 146 of each mover 136, 138, 140, 142 includes one or more conductor arrays (not shown). Electrical current (not shown) is individually supplied to each conductor array by the control system 22. For each reaction mover 136, 138, 140, 142 the electrical current in each conductor interacts with the magnetic field(s) generated by one or more of the magnets in the magnet array. This causes a force (Lorentz type force) between the conductors and the magnets.

Specifically, the first component (not shown) and the second component 146 of the left X reaction mover 136 interact to selectively move the left X reaction mass 88 along the X axis relative to the reaction base 102. In the embodiments provided herein, the left X reaction mover 136 is a commutated, linear motor. For the left X reaction mover 136, the first component is secured to the left X reaction mass 88, while the second component 146 is secured to the reaction base 102 above the left X guide 110.

Similarly, the first component (not shown) and the second component 146 of the right X reaction mover 138 interact to selectively move the right X reaction mass 90 along the X axis relative to the reaction base 102. In the embodiments provided herein, the right X reaction mover 138 is a commutated, linear motor. For the right X reaction mover 138, the first component is secured to the right X reaction mass 90, while the second component 146 is secured to the reaction base 102 above the right X guide 112.

For the rear Y reaction mover 140, the first component 144 and the second component 146 interact to selectively move the rear Y reaction mass 104 along the Y axis relative to the reaction base 102. In the embodiments provided herein, the rear Y reaction mover 140 is a commutated, linear motor. For the rear Y reaction mover 140, the first component 144 is secured to the rear Y reaction mass 104, while the second component 146 is secured to the reaction base 102 above the rear Y guide 114.

For the front Y reaction mover 142, the first component 144 and the second component 146 interact to selectively move the front Y reaction mass 142 along the Y axis relative to the reaction base 102. In the embodiments provided herein, the front Y reaction mover 142 is a commutated, linear motor. For the front Y reaction mover 142, the first component 144 is secured to the front Y reaction mass 106, while the second component 146 is secured to the reaction base 102 above the front Y guide 124.

In this embodiment, the first component 144 of each reaction mover 136, 138, 140, 142 includes a pair of spaced apart magnet arrays (not shown), while the second component 146 includes a conductor array (not shown). Alternately, for example, the first component of each reaction mover 136, 138, 140, 142 could include a conductor array while the second component could include a pair of spaced apart magnet arrays.

Preferably, the reaction mover assembly 108 also includes (i) a left X trim mover 148 for moving the left X reaction mass 88 relative to the mounting base 24 and (ii) a right X trim mover 150 for moving the right X reaction mass 90 relative to the mounting base 24. The trim movers 148, 150 are used to adjust the position of the X reaction masses 88, 90 to cancel any positional errors of the X reaction masses 88, 90, to cancel any steady-state velocity of the X reaction masses 88, 90, and/or to inhibit the assembly center of gravity 25 from shifting.

Each of trim movers 148, 150 can include one or more rotary motors, voice coil motors, linear motors, electromagnetic actuators, and/or force actuators. In the embodiment illustrated in the Figures, each of the trim movers 148, 150 includes a first component (not shown), and an adjacent second component 154. In the embodiments provided herein, one of the components 154 of each trim mover 148, 150 includes one or more magnet arrays and the other component 154 of each trim mover 148, 150 includes one or more conductor arrays. Electrical current (not shown) is individually supplied to each conductor array by the control system 22. For each trim mover 148, 150 the electrical current in each conductor interacts with the magnetic field(s) generated by one or more of the magnets in the magnet array. This causes a force (Lorentz type force) between the conductors and the magnets.

Specifically, the first component and the second component 154 of the left X trim mover 148 interact to selectively move the left X reaction mass 88 along the X axis relative to the mounting base 24. In the embodiments provided herein, the left X trim mover 148 is a commutated, linear motor. For the left X trim mover 148, the first component is secured to the left X reaction mass 88, while the second component 154 is secured to the mounting base 24 with a left trim frame 156 (only a portion is illustrated in FIGS. 1–3).

Similarly, the first component and the second component 154 of the right X trim mover 150 interact to selectively move the right X reaction mass 90 along the X axis relative to the mounting base 24. In the embodiments provided herein, the right X trim mover 150 is a commutated, linear motor. For the right X trim mover 150, the first component is secured to the right X reaction mass 90, while the second component 154 is secured to the mounting base 24 with a right trim frame 158 (only a portion is illustrated in FIGS. 1–3).

In this embodiment, the first component of each trim mover 156, 158 includes a pair of spaced apart magnet arrays (not shown), while the second component 154 includes a conductor array (not shown). Alternately, for example, the first component of each trim mover 156, 158 could include a conductor array while the second component could include a pair of spaced apart magnet arrays.

Preferably, each of the movers 76A, 76B, 78, 80 in the stage mover assembly 16, each of the reaction movers 136, 138, 140, 142 of the reaction mover assembly 108 and each of the trim movers 148, 150 are at the same height along the Z axis. In the X axis, the Y stage mover 80, a center of gravity of the device table 48, a center of gravity of the guide assembly 50 are preferably in line. In the Y axis, the center of gravity of the device table 48, and the fluid bearing between the device table 48 and the guide assembly 50 are preferably in line. In the Y axis, the center of gravity of the left X reaction mass 88, the left X stage mover 76A, the left X reaction mover 136 and the left X trim mover 148 are preferably in line. In the Y axis, the center of gravity of the right X reaction mass 90, the right X stage mover 76B, the right X reaction mover 138, and the right X trim mover 150 are preferably in line.

The measurement system 20 monitors movement of the stage 14 relative to the stage base 12, or to some other reference such as an optical assembly 200 (illustrated in FIG. 11). With this information, the stage mover assembly 16 can be used to precisely position of the stage 14. The design of the measurement system 20 can be varied. For example, the measurement system 20 can utilize laser interferometers, encoders, and/or other measuring devices to monitor the position of the stage 14.

Typically, the measurement system 20 monitors the position of the device table 48 along the X axis, along the Y axis, and about the Z axis. More specifically, the measurement system 20 measures the position of the device table 48 relative to the guide assembly 50 along the Y axis, and the measurement system 20 measures the position of the device table 48 along the Y axis, along the X axis, and about the Z axis relative to the optical assembly 200.

As provided herein, the measurement system 20 can utilize a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Additionally, the measurement system 20 includes an XZ interferometer 160 and a Y interferometer 162. The XZ interferometer 160 includes an XZ mirror 164 and an XZ block 166. The XZ block 166 interacts with the XZ mirror 164 to monitor the location of the device table 48 along the X axis and about the Z axis (theta Z). More specifically, the XZ block 166 generates a pair of spaced apart laser beams (not shown) that are reflected off of the XZ mirror 164. With these laser beams, the location of the device table 48 along the X axis and about the Z axis can be monitored. Further, because the device table 48 does not move relative to the guide assembly 50 along the X axis or about the Z axis, the location of the guide assembly 50 along the X axis and about the Z axis can also be monitored by the XZ interferometer 160.

In the embodiment illustrated in the Figures, the XZ mirror 164 is rectangular shaped and extends along one side of the device table 48. The XZ block 166 is positioned away from the device table 48. The XZ block 166 can be secured to the apparatus frame 202 (illustrated in FIG. 11) or some other location that is isolated from vibration.

Somewhat similarly, the Y interferometer 162 includes a Y mirror 168 and a Y block 170. The Y mirror 168 interacts with the Y block 170 to monitor the position of the device table 48 along the Y axis. More specifically, the Y block 170 generates a laser beam that is reflected off of the Y mirror 168. With this laser beam, the location of the device table 48 along the Y axis can be monitored. Further, because the position of the device table 48 relative to the guide assembly 50 along the Y axis is measured with the encoder, the position of the guide assembly 50 along the Y axis can also be monitored.

In the embodiment illustrated in the Figures, the Y mirror 168 is rectangular shaped and is positioned along one of the sides of the device table 48. The Y block 170 is positioned away from the device table 48. The Y block 170 can be secured to the apparatus frame 202 (illustrated in FIG. 11) or some other location that is isolated from vibration.

Additionally, the measurement system 20 can include one or more sensors (not shown) that measure the position of the upper table component 52 relative to the lower table component 54.

Preferably, the measurement system 20 also includes one or more measuring devices (not shown) such as laser interferometers, encoders, and/or other measuring devices to monitor the position of the reaction masses 88, 90, 104, 106 relative to the reaction base 102.

The control system 22 controls the stage mover assembly 16 to precisely position the stage 14 and the device 26. In the embodiment illustrated in FIGS. 1–3, the control system 22 directs and controls the current to the conductor array for each of the X stage movers 76A, 76B to control movement of the stage 14 along the X axis and about the Z axis. Similarly, the control system 22 directs and controls the current to conductor array of the Y stage mover 80 and the conductor 98 of the Y guide mover 78 to control movement of the stage 14 along the Y axis.

Additionally, the control system 22 directs and controls current to the reaction mover assembly 108 and the trim movers 148, 150 to control the position of the reaction masses 88, 90, 104, 106. More specifically, the control system 22 directs current to the conductor array for each X reaction mover 136, 138 to independently control the position of each X reaction mass 88, 90 along the X axis relative to the reaction base 102. Further, the control system 22 directs current to the conductor array for each X trim mover 148, 150 to independently control the position of each X reaction mass 88, 90 along the X axis relative to the mounting base 24. Further, the control system 22 directs current to the conductor array for each Y reaction mover 140, 142 to independently control the position of each Y reaction mass 104, 106 relative to the reaction base 102 along the Y axis.

Figure 5A:
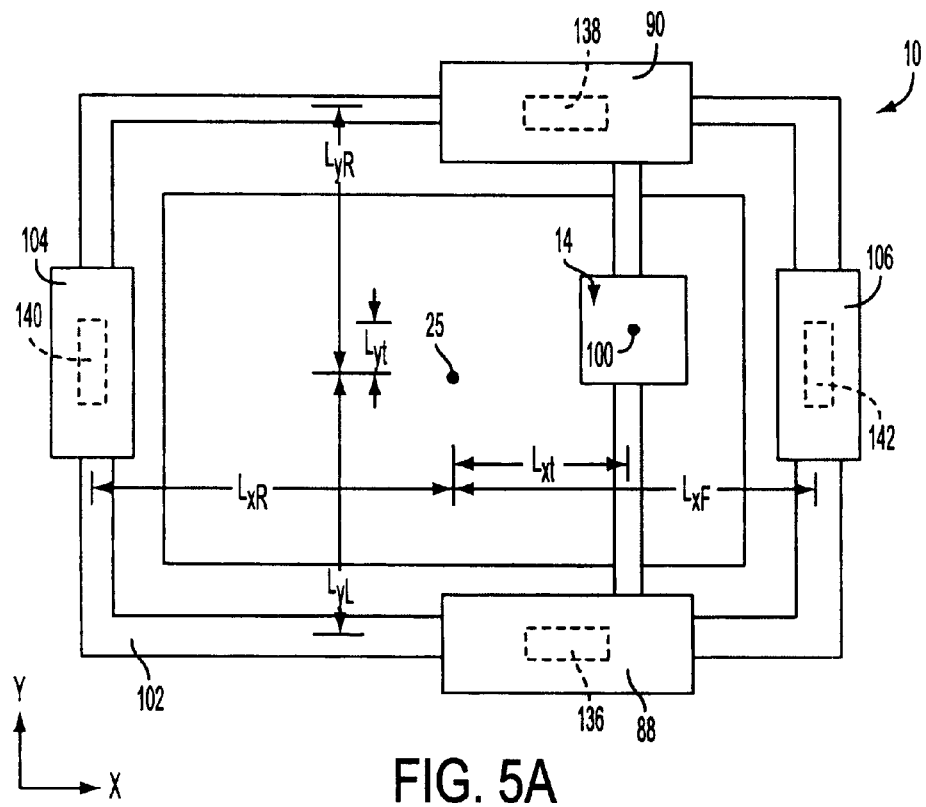
FIG. 5A is a simplified, schematic top view of a portion of a stage assembly.

FIG. 5A illustrates simplified schematic top view of a portion of the stage assembly 10 that facilitate a discussion of the movement of the reaction assembly 18. In particular, FIG. 5A illustrates the stage assembly 10 with the stage 14 positioned away from the assembly center of gravity 25. Stated another way, in FIG. 5A, the stage 14 is (i) positioned closer to the front Y reaction mass 106 than the rear Y reaction mass 104, and (ii) positioned closer to the right X reaction mass 90 than the left X reaction mass 88.

The following symbols are used in conjunction with FIG. 5A and the discussion provided below to describe the preferred way that the control system 20 controls movement of the reaction assembly 18:

$L_{yL}$ represents the distance along the Y axis between the center of the left X reaction mass 88 and the assembly center of gravity 25.

$L_{yR}$ represents the distance along the Y axis between the center of the right X reaction mass 90 and the assembly center of gravity 25.

$L_{yt}$ represents the distance along the Y axis between the stage center of gravity 100 and the assembly center of gravity 25.

$L_{xR}$ represents the distance along the X axis between the center of the rear Y reaction mass 104 and the assembly center of gravity 25.

$L_{xF}$ represents the distance along the X axis between the center of the front Y reaction mass 106 and the assembly center of gravity 25.

$L_{xt}$ represents the distance along the X axis between the stage center of gravity 100 and the assembly center of gravity 25.

$M_s$ represents the total mass of the stage 14.

$M_{Lx}$ represents the total mass of the left X reaction mass 88.

$M_{Rx}$ represents the total mass of the right X reaction mass 90.

$M_{Ry}$ represents the total mass of the rear Y reaction mass 104.

$M_{Fy}$ represents the total mass of the front Y reaction mass 106.

$M_d$ represents the total mass of the device table 48.

$M_{cm}$ represents the combined mass of the reaction masses 88, 90, 104, 106, the reaction base 102 and the guide assembly 50.

$V^x_s$ represents the velocity of the stage 14 along the X axis.

$V^x_{LX}$ represents the velocity of the left X reaction mass 88 along the X axis.

$V^x_{RX}$ represents the velocity of the right X reaction mass 90 along the X axis.

$V^Y_{RY}$ represents the velocity of the rear Y reaction mass 104 along the Y axis.

$V^Y_{FY}$ represents the velocity of the front Y reaction mass 106 along the Y axis.

$V^Y_d$ represents the velocity of the device table 48 along the Y axis.

$V^Y_{cm}$ represents the velocity of the reaction masses 88, 90, 104, 106, the reaction base 102, and the guide assembly 50 along the Y axis.

The basic servo strategy of the control system 22 is as follows:

$$M_{Lx}V^x_{LX}+M_{Rx}V^x_{RX}+M_sV^x_s=\text{constant}=0$$

$$M_{Ry}V^Y_{RY}+M_{Fy}V^Y_{FY}+M_dV^Y_d=\text{constant}=0$$

$$M_{Lx}L_{yL}V^x_{LX}-M_{Rx}L_{yR}V^x_{RX}-M_{Ry}L_{xR}V^Y_{RY}+M_{Fy}L_{xF}V^Y_{FY}-M_sL_{yt}V^x_s+M_dL_{xt}V^Y_d=\text{constant}=0$$

Thus, we have three equations and four unknowns. The unknowns include namely $V^x_{LX}$, $V^x_{RX}$, $V^Y_{RY}$, and $V^Y_{FY}$.

Another equation is needed. For example, $V^x_{LX}$ could be equal to $V^x_{RX}$, or $V^Y_{RY}$ could be equal to $V^Y_{FY}$.

Alternately, some other related equation could be utilized. Basically, the control system 22 controls the locations of the reaction masses 88, 90, 104, 106 so that the assembly center of gravity 25 does not shift. Stated anther way, the control system 22 controls the locations of the reaction masses 88, 90, 104, 106 so that the assembly center of gravity 25 is in a fixed location at all times.

Alternately, the control system 22 could control the reaction mover assembly 108 so that the reaction masses 88, 90, 104, 106 are positioned for maximum stroke in the future.

Figure 5B:
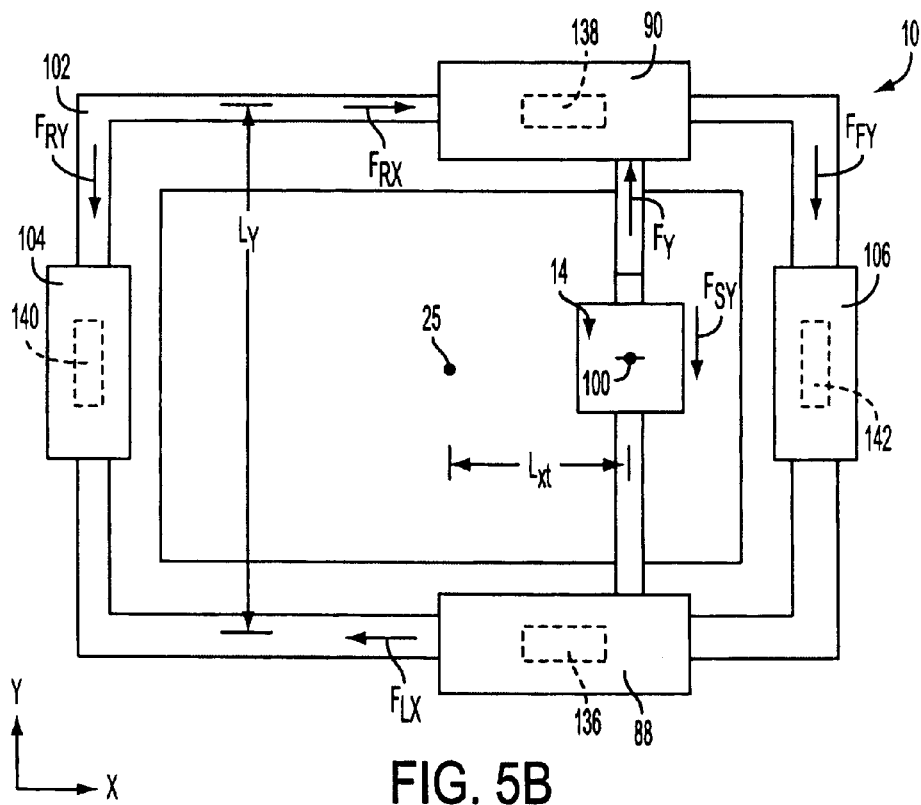
FIG. 5B is another simplified, schematic top view of a portion of a stage assembly.

FIG. 5B illustrates simplified schematic top view of a portion of the stage assembly 10 that facilitates a discussion of how reaction assembly 18 can be used to counteract the theta Z reaction forces and the Y reaction forces generated by the stage mover assembly (not shown in FIG. 5B). In particular, FIG. 5B illustrates the stage assembly 10 with the stage 14 positioned away from the assembly center of gravity 25. Stated another way, in FIG. 5B, the stage 14 is (i) positioned closer to the front Y reaction mass 106 than the rear Y reaction mass 104, and (ii) positioned approximately half way between the right X reaction mass 90 and the left X reaction mass 88.

The following symbols are used in conjunction with FIG. 5B and the discussion provided below:

$L_{Xt}$ represents the distance along the X axis between the stage center of gravity 100 and the assembly center of gravity 25.

$L_Y$ represents the distance along the Y axis between the center of the left X reaction mass 88 and the right X reaction mass 90.

$F_{SY}$ represents the Y force generated on the stage 14 by the stage mover assembly 16 during movement of the stage 14 along the Y axis.

$F_Y$ represents the Y reaction force transferred to the right X reaction mass 90 during movement of the stage 14 by the stage mover assembly 16 along the Y axis. $F_Y$ is equal in magnitude to $F_{SY}$, but $F_Y$ is in the opposite direction of $F_{SY}$.

$F_{LX}$ represents the theta Z correction force generated by the left X reaction mover 136 on the reaction base 102 when it moves the left X reaction mass 88.

$F_{RX}$ represents the theta Z correction force generated by the right X reaction mover 138 on the reaction base 102 when it moves the right X reaction mass 90. $F_{RX}$ is equal in magnitude and in the opposite direction as $F_{LX}$ ($F_{LX}=-F_{RX}$).

$F_{RY}$ represents the Y correction force generated by the rear Y reaction mover 140 on the reaction base 102 when it moves the rear Y reaction mass 104.

$F_{FY}$ represents the Y correction force generated by the front Y reaction mover 142 on the reaction base 102 when it moves the front Y reaction mass 106.

Referring to FIG. 5B, during movement of the stage 14 along the Y axis, he theta Z reaction force (torque) is imparted upon the X reaction mass 90 and the reaction base 102 by the stage mover assembly 16. The theta Z reaction force is equal to $L_{Xt}*F_Y$ (counterclockwise). In order to counteract and/or cancel the theta Z reaction force, the X reaction movers 136, 138 move the X reaction masses 88, 90 in opposite directions. Stated another way the X reaction movers 88, 90 are used to generate the theta Z correction force upon the reaction base 102. The theta Z correction torque shall be equal to $F_{LX}*L_Y$. Preferably, the theta Z correction force is substantially equal and opposite to the theta Z reaction force. With this design, $L_{Xt}*F_Y=F_{LX}*L_Y=-F_{RX}*L_Y$. With this design, the reaction assembly 18 minimizes the influence of reaction forces on the stage base 12.

Further, to counteract the Y reaction force $F_Y$ upon the reaction base 102, the Y reaction movers 140, 142 move the Y reaction masses 104, 106. Preferably, the total Y correction force generated upon the reaction base 102 is substantially equal and opposite to the Y reaction force ($F_{RY}+F_{FY}+F_Y=0$).

FIG. 6 illustrates a second embodiment of a stage assembly 10 having features of the present invention. More specifically, FIG. 6 illustrates that the reaction assembly 18 provided herein reduces and minimizes the reaction forces for a stage assembly 10 that includes multiple stages 14. The stage assembly 10 illustrated in FIG. 6 includes the stage base 12, two stages 14, a stage mover assembly 16 for each stage 14, the reaction assembly 18, the measurement system 20 (only a portion is illustrated in FIG. 6), and the control system 22. Each of the components are somewhat similar to the equivalent components described above and illustrated in FIGS. 1–3. However, the control system 22 will have to be modified to control movement of both stages 14.

Also, the reaction mover assembly 108 can include (i) a front Y trim mover 152 for moving the front Y reaction mass 106 relative to the mounting base 24, and (ii) a rear Y trim mover (not shown) for moving the rear Y reaction mass 104 relative to the mounting base 24. The Y trim movers 152 are used to counteract position errors or drift of the Y reaction mass 104, 106. The design of the Y trim movers 152 is somewhat similar to the design of the X trim movers 148, 150. The Y trim movers 152 can be incorporated into each embodiment provided herein. The front Y trim mover 152 is connected to the mounting base (not illustrated in FIG. 6) with a front Y trim frame 153.

Figure 8:
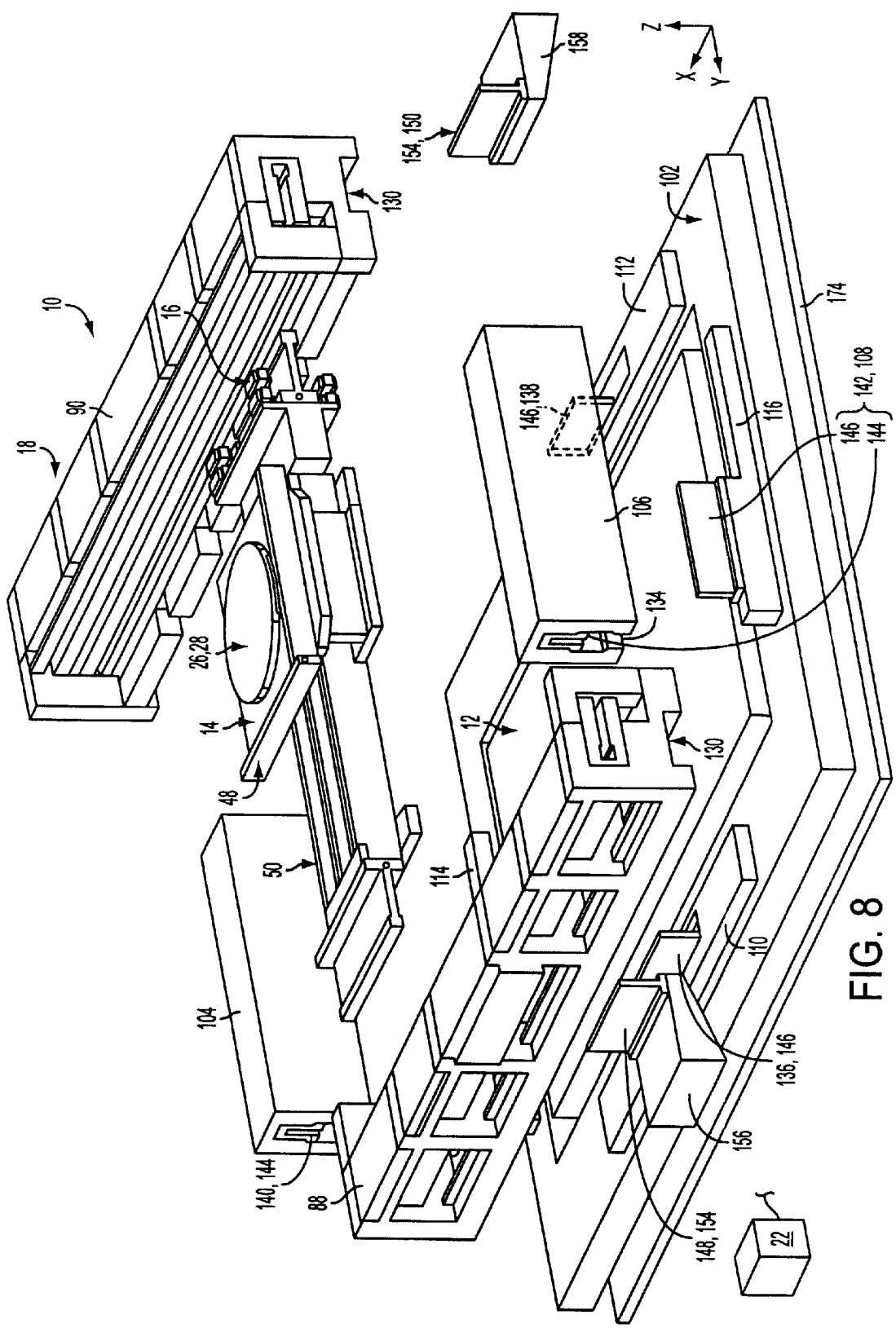
FIG. 8 is an exploded perspective of the stage assembly of FIG. 7.

FIGS. 7 and 8 illustrate a third embodiment of a stage assembly having features of the present invention. In FIGS. 7 and 8, the stage base 12, the stage 14, the stage mover assembly 16, the reaction assembly 18, the measurement system 20 (only a portion is illustrated in FIGS. 7 and 8), and the control system 22 are somewhat similar to the equivalent components described above.

However, in the design illustrated in FIGS. 7 and 8, the reaction base 102 is not fixedly secured to the stage base 12. Instead, the reaction base 102 is supported by a reaction support 174. In this embodiment, the reaction base 102 is generally rectangular frame shaped and encircles the stage base 12. Somewhat similarly, the reaction support 174 is generally rectangular frame shaped. The reaction support 174 is positioned directly below the reaction base 102. The reaction support 174 can be fixedly secured to the mounting base (not shown in FIGS. 7 and 8)

In this embodiment, the reaction base 102 is maintained above the reaction support 174 with a vacuum preload type fluid bearing. More specifically, in this embodiment, the reaction base 102 includes a plurality of spaced apart fluid outlets (not shown), and a plurality of spaced apart fluid inlets (not shown). Pressurized fluid (not shown) is released from the fluid outlets towards the reaction support 174 and a vacuum is pulled in the fluid inlets to create a vacuum preload type, fluid bearing between the reaction base 102 and the reaction support 174. The vacuum preload type fluid bearing maintains the reaction base 102 spaced apart along the Z axis, relative to the reaction support 174. Further, the vacuum preload type fluid bearing allows for motion of the reaction base 102 along the X axis, along the Y axis and about the Z axis relative to the reaction support 174.

Alternately, the reaction base 102 can be supported spaced apart from the reaction support 174 in other ways. For example, a magnetic type bearing (not shown) or a roller type bearing (not shown) could be utilized that allows for motion of the reaction base 102 relative to the reaction support 174.

As provided above, through the principle of conservation of momentum, movement of the stage 14 with the X stage movers 76A, 76B along the X axis in one direction, moves the X reaction masses 88, 90 of the reaction assembly 18 in the opposite direction along the X axis. Further, movement of the device table 48 and/or the guide assembly 50 with the Y movers 78, 80 along the Y axis in one direction, creates the Y reaction force on the X reaction masses 88, 90 and the reaction base base 102 along the Y axis in the opposite direction.

In this embodiment, the reaction assembly 18 is isolated from the stage base 12. In this embodiment, the reaction mover assembly 108 moves the Y reaction masses 104, 106 to counteract the reaction forces that are created on the reaction base 102 by the Y movers 78, 80. Further, the reaction mover assembly 108 moves the X reaction masses 88, 90 and/or the Y reaction masses 104, 106 to counteract the theta Z reaction force that is created on the reaction base 102. Thus, the reaction mover assembly 108 reduces and minimizes the influence of the reaction forces from the stage mover assembly 16 on the position of the reaction base 102 and the mounting base 24. With this design, the reaction forces from the stage mover assembly 16 are negated. This inhibits the reaction forces from the stage mover assembly 16 from influencing the position of the stage base 12.

Figure 10:
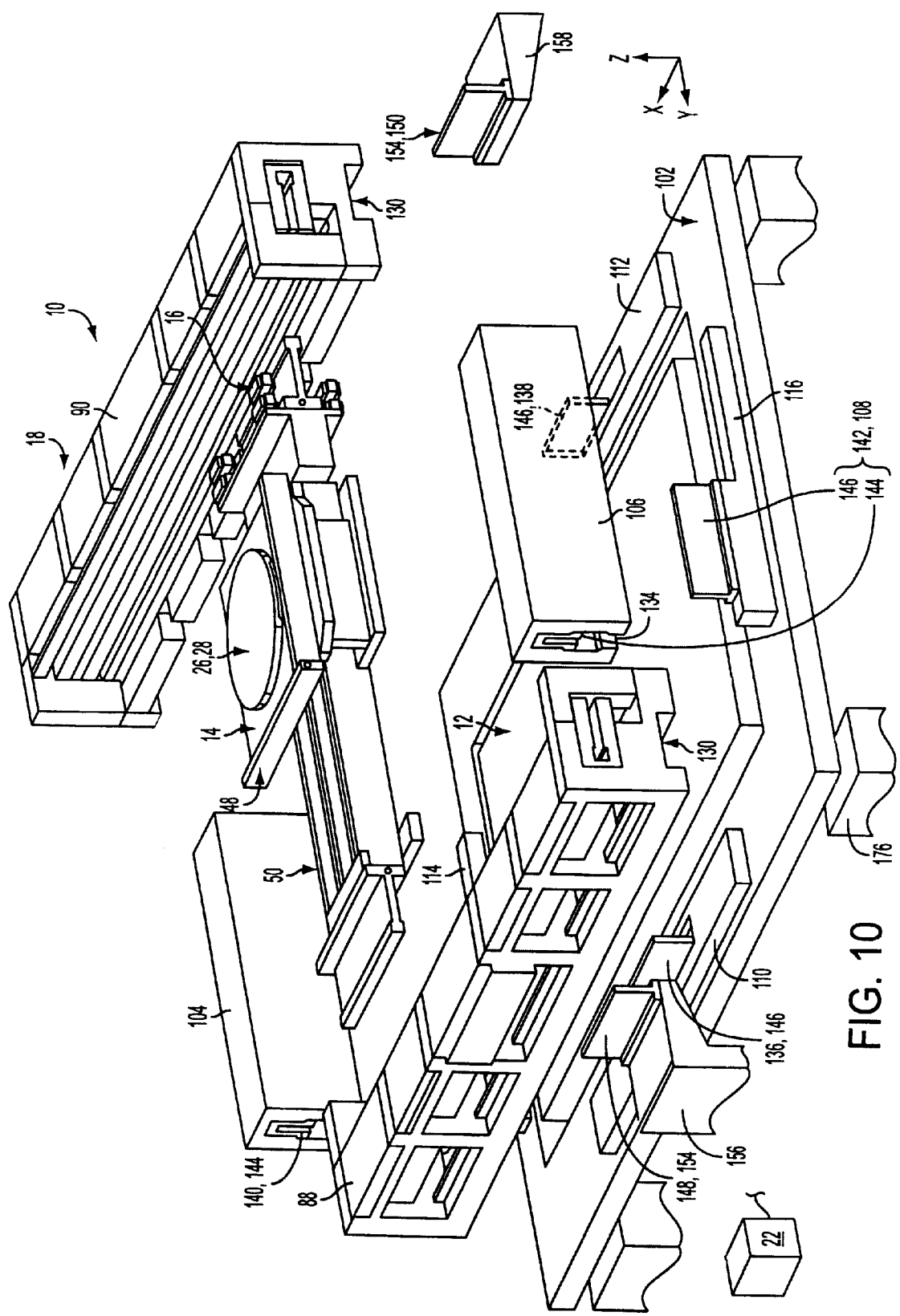
FIG. 10 is an exploded perspective of the stage assembly of FIG. 9.

FIGS. 9 and 10 illustrate a fourth embodiment of a stage assembly having features of the present invention. In FIGS. 9 and 10, the stage base 12, the stage 14, the stage mover assembly 16, the reaction assembly 18, the measurement system 20 (only a portion is illustrated in FIGS. 9 and 10), and the control system 22 are somewhat similar to the equivalent components described above.

However, in the design illustrated in FIGS. 9 and 10, the reaction base 102 is again not fixedly secured to the stage base 14. Instead, the reaction base 102 is fixedly secured to the mounting base 24 with a reaction frame 176. In this embodiment, the reaction base 102 is generally rectangular frame shaped and encircles the stage base 12. Further, the reaction frame 176 includes a plurality of beams for fixedly securing the reaction base 102 to the mounting base 24.

In this embodiment, the reaction assembly 18 is isolated from the stage base 12. Further, in this embodiment, the reaction mover assembly 108 moves the Y reaction masses 104, 106 to counteract the reaction forces that are created on the reaction base 102, the reaction frame 176 and the mounting base 24 by the Y movers 78, 80. Further, the reaction mover assembly 108 moves the X reaction masses 88, 90 and/or the Y reaction masses 104, 106 to counteract the theta Z reaction force that is created on the reaction base 102, the reaction frame 176 and the mounting base 24. Thus, the reaction mover assembly 108 reduces and minimizes the influence of the reaction forces from the stage mover assembly 16 on the position of the reaction base 102, the reaction frame 176 and the mounting base 24. With this design, the reaction forces from the stage mover assembly 16 are negated. This inhibits the reaction forces from the stage mover assembly 16 from influencing the position of the stage base 12.

FIG. 11 is a schematic view illustrating an exposure apparatus 30 useful with the present invention. The exposure apparatus 30 includes the apparatus frame 202, an illumination system 204 (irradiation apparatus), a reticle stage assembly 206, the optical assembly 200 (lens assembly), and a wafer stage assembly 210. The stage assemblies 10 provided herein can be used as the wafer stage assembly 210. Alternately, with the disclosure provided herein, the stage assemblies 10 provided herein can be modified for use as the reticle stage assembly 206.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 11 supports the optical assembly 200 and the illumination system 204 and the reticle stage assembly 206 above the mounting base 24.

The illumination system 200 includes an illumination source 212 and an illumination optical assembly 214. The illumination source 212 emits a beam (irradiation) of light energy. The illumination optical assembly 214 guides the beam of light energy from the illumination source 212 to the optical assembly 200. The beam illuminates selectively different portions of the reticle 32 and exposes the semiconductor wafer 28. In FIG. 11, the illumination source 212 is illustrated as being supported above the reticle stage assembly 206. Typically, however, the illumination source 212 is secured to one of the sides of the apparatus frame 202 and the energy beam from the illumination source 212 is directed to above the reticle stage assembly 206 with the illumination optical assembly 214.

The optical assembly 200 projects and/or focuses the light passing through the reticle to the wafer. Depending upon the design of the exposure apparatus 30, the optical assembly 200 can magnify or reduce the image illuminated on the reticle.

The reticle stage assembly 206 holds and positions the reticle relative to the optical assembly 200 and the wafer. Similarly, the wafer stage assembly 210 holds and positions the wafers with respect to the projected image of the illuminated portions of the reticle in the operational area. In FIG. 11, the wafer stage assembly 210 utilizes a stage assembly 10 having features of the present invention. Depending upon the design, the exposure apparatus 30 can also include additional motors to move the stage assemblies 206, 210.

There are a number of different types of lithographic devices. For example, the exposure apparatus 30 can be used as scanning type photolithography system that exposes the pattern from the reticle onto the wafer with the reticle and the wafer moving synchronously. In a scanning type lithographic device, the reticle is moved perpendicular to an optical axis of the optical assembly 200 by the reticle stage assembly 206 and the wafer is moved perpendicular to an optical axis of the optical assembly 200 by the wafer stage assembly 210. Scanning of the reticle and the wafer occurs while the reticle and the wafer are moving synchronously.

Alternately, the exposure apparatus 30 can be a step-and-repeat type photolithography system that exposes the reticle while the reticle and the wafer are stationary. In the step and repeat process, the wafer is in a constant position relative to the reticle and the optical assembly 200 during the exposure of an individual field. Subsequently, between consecutive exposure steps, the wafer is consecutively moved by the wafer stage perpendicular to the optical axis of the optical assembly 200 so that the next field of the wafer is brought into position relative to the optical assembly 200 and the reticle for exposure. Following this process, the images on the reticle are sequentially exposed onto the fields of the wafer so that the next field of the wafer is brought into position relative to the optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 200 included in the photolithography system, the optical assembly 200 need not be limited to a reduction system. It could also be a 1× or magnification system.

With respect to an optical assembly 200, when far ultra-violet rays such as the excimer laser is used, glass materials such as quartz and fluorite that transmit far ultra-violet rays is preferable to be used. When the $F_2$ type laser or x-ray is used, the optical assembly 200 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 12:
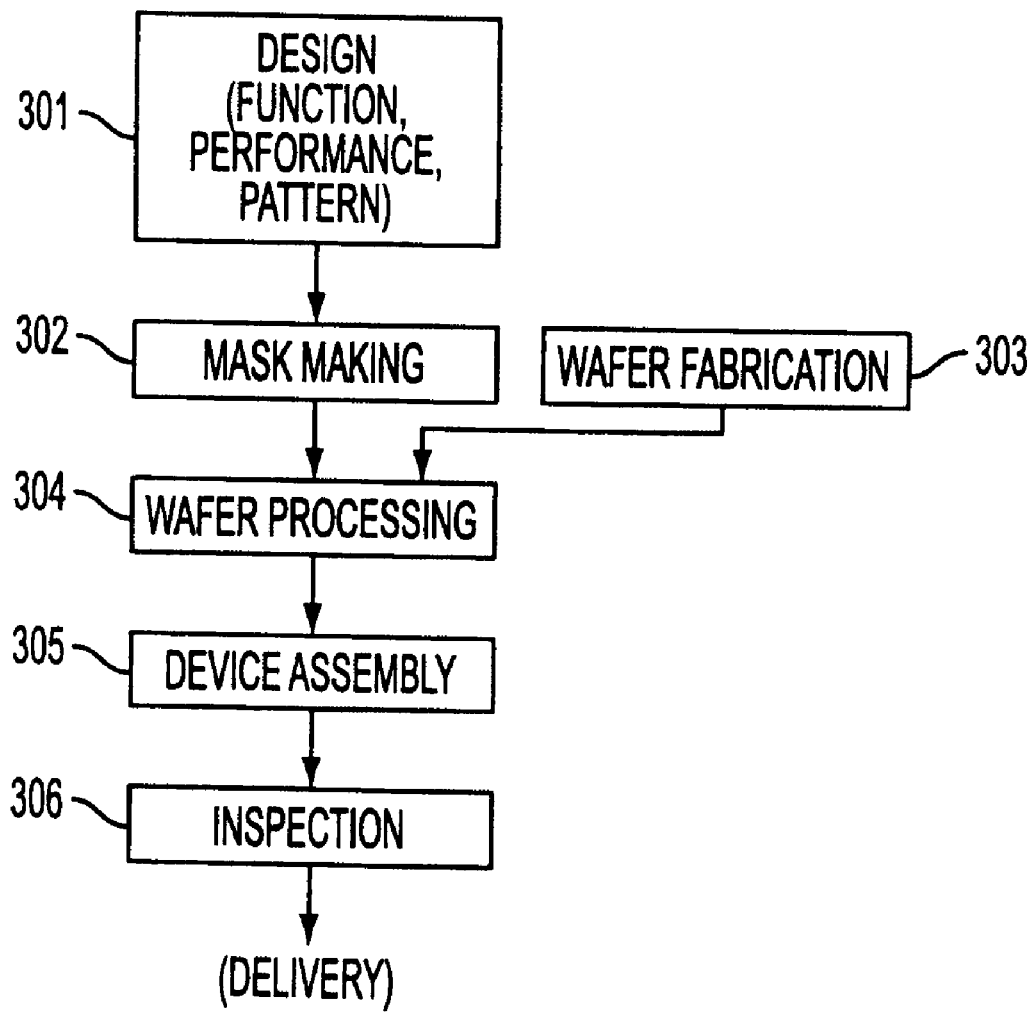
FIG. 12 is a flow chart that outlines a process for manufacturing a device in accordance with the present invention.

Further, semiconductor devices can be fabricated using the above described systems, by the process shown generally in FIG. 12. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 13:
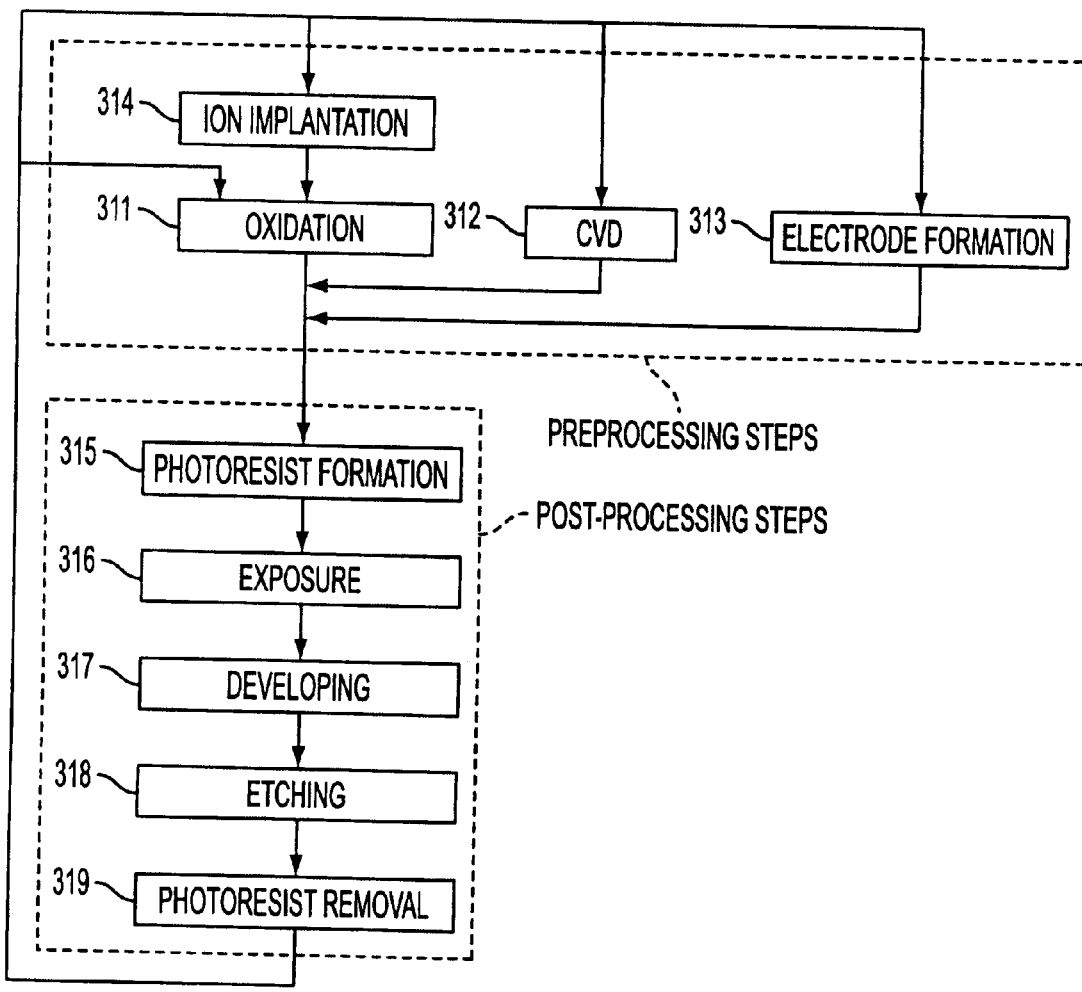
FIG. 13 is a flow chart that outlines device processing in more detail.

FIG. 13 illustrates a detailed flowchart example of the above-mentioned step 304 in the case of fabricating semiconductor devices. In FIG. 13, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device along an X axis and along a Y axis, the stage assembly comprising:
   a device table that retains the device;
   a mover assembly connected to the device table, the mover assembly moving along the X axis and the Y axis;
   a first X reaction mass that is secured to the mover assembly;
   a reaction base that supports the first X reaction mass and allows the first X reaction mass to move relative to the reaction base along the X axis;
   a first Y reaction mass that is movable relative to the first X reaction mass; and
   a first Y reaction mover connected to the first Y reaction mass, the first Y reaction mover moving relative to the reaction base and generates a Y correction force along the Y axis that is transferred to the reaction base.

2. The stage assembly of claim 1 further comprising a first X reaction mover connected to the first X reaction mass, the first X reaction mover moving the first X reaction mass relative to the reaction base.

3. The stage assembly of claim 2 wherein movement of the device table generates a reaction force about a Z axis, and wherein movement of the first X reaction mass by the first X reaction mover counteracts the reaction force about the Z axis.

4. The stage assembly of claim 2 further comprising (i) a mounting base that supports the reaction base, and (ii) a first X trim mover including a first component that is secured to the first X reaction mass, and a second component that is coupled to the mounting base, the first X trim mover moving the first X reaction mass relative to the mounting base with one degree of freedom.

5. The stage assembly of claim 4 further comprising a second X reaction mass and a second X trim mover including a first component that is secured to the second X reaction mass, and a second component that is coupled to the mounting base, the second X trim mover moving the second X reaction mass relative to the mounting base with one degree of freedom.

6. The stage assembly of claim 5 further comprising a first Y trim mover including a first component that is secured to the first Y reaction mass, and a second component that is coupled to the mounting base, the first Y trim mover moving the first Y reaction mass relative to the mounting base with one degree of freedom.

7. The stage assembly of claim 6 further comprising a second Y reaction mass, a second Y reaction mover that is connected to the second Y reaction mass, and a second Y trim mover, the second Y reaction mover moving the second Y reaction mass relative to the reaction base and generating a Y correction force along the Y axis that is transferred to the reaction base, the second Y trim mover including a first component that is secured to the second Y reaction mass, and a second component that is coupled to the mounting base, the second Y trim mover moving the second Y reaction mass relative to the mounting base with one degree of freedom.

8. The stage assembly of claim 1 wherein the mover assembly includes a first component and a second component that interacts with the first component for causing a force between the first component and the second component, the first component being connected to the first X reaction mass and a second component being connected to the device table.

9. The stage assembly of claim 1 further comprising a second X reaction mass that is secured to the mover assembly, the second X reaction mass moving with at least one degree of freedom relative to the first X reaction mass.

10. The stage assembly of claim 9 further comprising a second X reaction mover connected to the second X reaction mass, the second X reaction mover moving the second X reaction mass relative to the first X reaction mass and the reaction base.

11. The stage assembly of claim 10 further comprising a first X reaction mover connected to the first X reaction mass, the first X reaction mover moving the first X reaction mass relative to the reaction base, wherein movement of the device table generates a reaction force about a Z axis, and wherein movement of at least one of the X reaction masses by at least one of the X reaction movers counteracts the reaction force about the Z axis.

12. The stage assembly of claim 9 further comprising a stage base that supports the device table, wherein the first X reaction mass moves with two degrees of freedom relative to the stage base and with one degree of freedom relative to the second X reaction mass, and the second X reaction mass moves with two degrees of freedom relative to the stage base and with one degree of freedom relative to the first X reaction mass.

13. The stage assembly of claim 9 further comprising a stage base that supports the device table, wherein the first X reaction mass moves with three degrees of freedom relative to the stage base and with one degree of freedom relative to the second X reaction mass, and the second X reaction mass moves with three degrees of freedom relative to the stage base and with one degree of freedom relative to the first X reaction mass.

14. The stage assembly of claim 1 further comprising a second X reaction mass that is secured to the mover assembly, wherein movement of the device table generates an X reaction force, and wherein the second X reaction mass moves relative to the reaction base to reduce the X reaction force.

15. The stage assembly of claim 1 further comprising a stage base that supports the device table, wherein the first X reaction mass moves with three degrees of freedom relative to the stage base.

16. The stage assembly of claim 1 further comprising a stage base that supports the device table, wherein the reaction base moves with three degrees of freedom relative to the stage base.

17. The stage assembly of claim 1 further comprising a stage base that supports the device table, and a second X reaction mass that is secured to the mover assembly, wherein movement of the device table generates reaction forces, and the second X reaction mass moves with two degrees of freedom relative to the stage base to reduce the reaction forces.

18. The stage assembly of claim 1 further comprising a stage base that supports the device table, and a second X reaction mass that is secured to the mover assembly, wherein movement of the device table generates reaction forces, and the second X reaction mass moves with three degrees of freedom relative to the stage base to reduce the reaction forces.

19. The stage assembly of claim 1 further comprising a stage base that supports the device table, wherein movement of the device table generates reaction forces, and wherein the first X reaction mass moves with three degrees of freedom relative to the stage base to reduce the reaction forces.

20. The stage assembly of claim 1 wherein the mover assembly includes an X stage mover that moves the device table along an X axis, the X stage mover including a moving component that is connected to the device table and a reaction component that interacts with the moving component, the reaction component being secured to the first X reaction mass.

21. The stage assembly of claim 1 wherein the mover assembly includes a first X stage mover and a second X stage mover that are connected to the device table and that move the device table along an X axis, wherein movement of the device table generates an X reaction force, and wherein movement of the first X reaction mass reduces the X reaction force that is transferred to the reaction base.

22. The stage assembly of claim 1 wherein the mover assembly includes a Y stage mover that is connected to the device table and moves the device table along a Y axis, and an X stage mover that is connected to the Y stage mover and moves the device table along an X axis.

23. An exposure apparatus including the stage assembly of claim 1.

24. A device manufactured with the exposure apparatus according to claim 23.

25. A wafer on which an image has been formed by the exposure apparatus of claim 23.

26. A stage assembly that moves a device along an X axis and along a Y axis, the stage assembly comprising:

a device table that retains the device;

a mover assembly connected to the device table, the mover assembly moving the device table along the X axis and the Y axis;

a first X reaction mass that is secured to the mover assembly;

a second X reaction mass that is secured to the mover assembly;

a reaction base that supports the first X reaction mass and the second X reaction mass and allows the first X reaction mass and the second X reaction mass to move relative to the reaction base along the X axis;

a first Y reaction mass;

a first Y reaction mover connected to the first Y reaction mass, the first Y reaction mover moving the first Y reaction mass relative to the reaction base and generating a first Y correction force along the Y axis that is transferred to the reaction base;

a second Y reaction mass; and a second Y reaction mover connected to the second Y reaction mass, the second Y reaction mover moving the second Y reaction mass relative to the reaction base and generating a second Y correction force along the Y axis that is transferred to the reaction base.

27. The stage assembly of claim 26 further comprising a reaction mover assembly connected to at least one of the X reaction masses, wherein movement of the device table generates a reaction force about a Z axis, and wherein the reaction mover assembly moves at least one of the X reaction masses to reduce the reaction force around the Z axis that are transferred to the reaction base.

28. The stage assembly of claim 26 further comprising (i) a mounting base that supports the reaction base, (ii) a first X trim mover that moves the first X reaction mass relative to the mounting base, the first X trim mover including a first component that is secured to the first X reaction mass, and a second component that is coupled to the mounting base, and (iii) a second X trim mover that moves the second X reaction mass relative to the mounting base, the second X trim mover including a first component that is secured to the second X reaction mass, and a second component that is coupled to the mounting base.

29. The stage assembly of claim 28 further comprising (i) a first Y trim mover that moves the first Y reaction mass relative to the mounting base, the first Y trim mover including a first component that is secured to the first Y reaction mass, and a second component that is coupled to the mounting base, and (ii) a second Y trim mover that moves the second Y reaction mass relative to the mounting base, the second Y trim mover including a first component that is secured to the second Y reaction mass, and a second component that is coupled to the mounting base.

30. The stage assembly of claim 29 further comprising a reaction mover assembly connected to at least one of the X reaction masses, wherein movement of the device table generates a reaction force about a Z axis, and wherein the reaction mover assembly moves at least one of the X reaction masses to reduce the reaction force around the Z axis that are transferred to the reaction base.

31. The stage assembly of claim 26, wherein the mover assembly includes a first component and a second component that interacts with the first component for causing a force between the first component and the second component, the first component being connected to at least one of the X reaction masses and a second component being connected to the device table.

32. A stage assembly comprising:

a stage that retains the device;

a stage base that supports the stage;

a mover assembly that includes a first component and a second component that is connected to the stage and interacts with the first component for causing a force between the first component and the second component, the mover assembly moving the stage with at least two degrees of freedom relative to the stage base and generating reaction forces in at least two degrees of freedom; and a reaction assembly including a reaction base, a first reaction mass that is coupled to the first component of the mover assembly and movable along a first direction, and a second reaction mass that is movable independently from the first reaction mass along a second direction that is different from the first direction, the reaction assembly counteracting the reaction forces in at least two degrees of freedom that are transferred to the reaction base.

33. The stage assembly of claim 32 wherein the reaction assembly moves the first reaction mass relative to the reaction base to reduce the amount of a first reaction force that is transferred to the reaction base in accordance with the movement of the stage in the first direction.

34. The stage assembly of claim 33 wherein the mover assembly imparts a rotation reaction force that acts about the axis that is perpendicular to the first and second directions upon the reaction base, and the reaction assembly generates a rotation correction force on the reaction base that counteracts the rotation reaction force.

35. The stage assembly of claim 34 wherein the reaction assembly includes a first reaction mover connected to the first reaction mass, the first reaction mover moving the first reaction mass relative to the reaction base to generate at least a portion of the rotation correction force.

36. The stage assembly of claim 34 wherein the reaction assembly includes a second reaction mover connected to the second reaction mass, the second reaction mover moving the second reaction mass relative to the reaction base to generate at least a portion of the rotation correction force.

37. The stage assembly of claim 34 wherein the reaction assembly includes a first reaction mover connected to the first reaction mass and a second reaction mover connected to the second reaction mass, and wherein the first reaction mover moves a first reaction mass and the second reaction moves the second reaction mass to generate the rotation correction force.

38. The stage assembly of claim 34 wherein the reaction assembly includes a second reaction mover connected to the second reaction mass, the second reaction mover moving the second reaction mass relative to the reaction base to generate a correction force on the reaction base, the correction force counteracting a second reaction force that is imparted upon the reaction base in accordance with the movement of the stage in the second direction.

39. The stage assembly of claim 34 wherein the mover assembly imparts a rotation reaction force that acts about the axis that is perpendicular to the first and second directions upon the reaction base, and the reaction assembly generates a rotation correction force on the reaction base that counteracts the rotation reaction force.

40. The stage assembly of claim 32 wherein the mover assembly imparts a first reaction force that is transferred to the reaction base in accordance with the movement of the stage in the first direction, a second reaction force that is imparted upon the reaction base in accordance with the movement of the stage in the second direction, and a rotation reaction force that acts about the axis that is perpendicular to the first and second directions, and the reaction assembly generates a second correction force on the reaction base that counteracts the second reaction force and a rotary correction force on the reaction base that counteracts the rotation reaction force.

* * * * *

UNITED STATES PATENT AND TRADEMARK OFFICE
CERTIFICATE OF CORRECTION

PATENT NO.      : 6,593,997 B1
DATED           : July 15, 2003
INVENTOR(S)     : Watson et al.

It is certified that error appears in the above-identified patent and that said Letters Patent is hereby corrected as shown below:

Column 26,
Line 1, please replace "claim 34" with -- claim 32 --.
Line 1, please replace "claim 34" with -- claim 32 --.

Signed and Sealed this

Twenty-first Day of October, 2003

JAMES E. ROGAN
*Director of the United States Patent and Trademark Office*